United States Patent
Yang et al.

(10) Patent No.: US 11,727,859 B2
(45) Date of Patent: Aug. 15, 2023

(54) DISPLAY PANEL AND DISPLAY DEVICE

(71) Applicant: BOE TECHNOLOGY GROUP CO., LTD., Beijing (CN)

(72) Inventors: Ming Yang, Beijing (CN); Zhenhua Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 48 days.

(21) Appl. No.: 17/224,463

(22) Filed: Apr. 7, 2021

(65) Prior Publication Data
US 2021/0225269 A1    Jul. 22, 2021

Related U.S. Application Data

(63) Continuation-in-part of application No. 16/638,703, filed on Feb. 12, 2020, now Pat. No. 11,398,540, and
(Continued)

(30) Foreign Application Priority Data

| Oct. 25, 2018 | (CN) | ................ 201811251738.X |
| Nov. 13, 2018 | (CN) | ................ 201811345869.4 |
| Feb. 28, 2019 | (CN) | ................ 201910150824.X |

(51) Int. Cl.
*G09G 3/3208* (2016.01)
*H10K 59/131* (2023.01)
(Continued)

(52) U.S. Cl.
CPC ............ *G09G 3/32* (2013.01); *G09G 3/3208* (2013.01); *H10K 50/86* (2023.02); *H10K 59/121* (2023.02);
(Continued)

(58) Field of Classification Search
CPC .............. H01L 27/3276; H01L 27/326; H01L 51/5281; G09G 3/3233; G09G 3/2088;
(Continued)

(56) References Cited

U.S. PATENT DOCUMENTS

| 7,545,347 B2 | 6/2009 | Kanda |
| 8,469,551 B2 | 6/2013 | Wolk et al. |

(Continued)

FOREIGN PATENT DOCUMENTS

| CN | 102110410 A | 6/2011 |
| CN | 102263975 A | 11/2011 |

(Continued)

OTHER PUBLICATIONS

Office Action in U.S. Appl. No. 16/512,924 dated Oct. 29, 2020.
(Continued)

*Primary Examiner* — Michael M Trinh
(74) *Attorney, Agent, or Firm* — Collard & Roe, P.C.

(57) ABSTRACT

A display panel and a display device are provided. The display panel includes a plurality of light emitting points; a plurality of pixel driving circuits, wherein at least one of the plurality of light emitting points is connected to at least one of the plurality of pixel driving circuits; and a plurality of electrode leads, the at least one of the plurality of light emitting points is connected to the at least one of the plurality of pixel driving circuits through at least one of the plurality of electrode leads; the plurality of pixel driving circuits are separated from the plurality of light emitting points.

20 Claims, 27 Drawing Sheets

Related U.S. Application Data a continuation-in-part of application No. 16/547,820, filed on Aug. 22, 2019, now Pat. No. 10,991,308, and a continuation-in-part of application No. 16/512,924, filed as application No. PCT/CN2019/079286 on Mar. 22, 2019, now Pat. No. 11,271,065.

(51) Int. Cl.
*G09G 3/32* (2016.01)
*H10K 59/121* (2023.01)
*H10K 50/86* (2023.01)

(52) U.S. Cl.
CPC ... *H10K 59/131* (2023.02); *G09G 2300/0426* (2013.01)

(58) Field of Classification Search
CPC ......... G09G 3/3208; G09G 2300/0426; G09G 2310/0281; G09G 2320/0204; G09G 2320/0233; G09G 3/32; H10K 59/131; H10K 59/121; H10K 50/86
See application file for complete search history.

(56) References Cited

U.S. PATENT DOCUMENTS

| | | | |
|---|---|---|---|
| 8,754,834 B2 | 6/2014 | Hasegawa | |
| 8,952,875 B2 | 2/2015 | Hasegawa | |
| 9,024,913 B1 | 5/2015 | Jung et al. | |
| 9,634,075 B2 | 4/2017 | Chung et al. | |
| 9,735,208 B2 | 8/2017 | Lee et al. | |
| 9,754,525 B2* | 9/2017 | Wu | G09G 3/2003 |
| 9,881,549 B2 | 1/2018 | Li et al. | |
| 9,960,194 B1* | 5/2018 | Park | G09G 3/3688 |
| 10,186,567 B2 | 1/2019 | Jeong et al. | |
| 10,991,308 B2* | 4/2021 | Yang | H01L 27/3265 |
| 11,271,065 B2 | 3/2022 | Yang et al. | |
| 11,398,540 B2 | 7/2022 | Yang et al. | |
| 2009/0179879 A1 | 7/2009 | Nozawa | |
| 2011/0024760 A1* | 2/2011 | Kimura | G09G 3/2003 257/E33.053 |
| 2011/0157250 A1 | 6/2011 | Hasegawa | |
| 2011/0157471 A1 | 6/2011 | Seshadri et al. | |
| 2011/0272675 A1 | 11/2011 | Chung et al. | |
| 2012/0140131 A1 | 6/2012 | Lanman et al. | |
| 2012/0169688 A1 | 7/2012 | Chen et al. | |
| 2013/0093983 A1 | 4/2013 | Kizu et al. | |
| 2014/0225939 A1 | 8/2014 | Hasegawa | |
| 2015/0156482 A1 | 6/2015 | Sun et al. | |
| 2015/0318305 A1 | 11/2015 | Zhang et al. | |
| 2016/0041434 A1 | 2/2016 | Qin et al. | |
| 2016/0171914 A1 | 6/2016 | Chen et al. | |
| 2016/0188063 A1 | 6/2016 | Kim | |
| 2016/0247448 A1 | 8/2016 | Toya et al. | |
| 2016/0252792 A1 | 9/2016 | Han et al. | |
| 2016/0254455 A1 | 9/2016 | Wang | |
| 2017/0018223 A1 | 1/2017 | Li et al. | |
| 2017/0125496 A1* | 5/2017 | Oh | H01L 27/3211 |
| 2017/0329190 A1 | 11/2017 | Chen et al. | |
| 2018/0190747 A1* | 7/2018 | Son | G09G 3/32 |
| 2018/0366058 A1 | 12/2018 | Gu et al. | |
| 2019/0156740 A1 | 5/2019 | Xu | |
| 2019/0236997 A1* | 8/2019 | Han | G09G 3/3208 |
| 2020/0212071 A1 | 7/2020 | Guo et al. | |
| 2020/0341573 A1 | 10/2020 | Yang | |
| 2020/0348784 A1 | 11/2020 | Wu et al. | |
| 2021/0181560 A1 | 6/2021 | Wang et al. | |

FOREIGN PATENT DOCUMENTS

| | | |
|---|---|---|
| CN | 103219355 A | 7/2013 |
| CN | 103278969 A | 9/2013 |
| CN | 103296033 A | 9/2013 |
| CN | 104155789 A | 11/2014 |
| CN | 104280912 A | 1/2015 |
| CN | 104376811 A | 2/2015 |
| CN | 104598074 A | 5/2015 |
| CN | 104599641 A | 5/2015 |
| CN | 104752468 A | 7/2015 |
| CN | 105097843 A | 11/2015 |
| CN | 105529351 A | 4/2016 |
| CN | 106444199 A | 2/2017 |
| CN | 106959783 A | 7/2017 |
| CN | 206470722 U | 9/2017 |
| CN | 107248391 A | 10/2017 |
| CN | 107678590 A | 2/2018 |
| CN | 108205198 A | 6/2018 |
| CN | 108257980 A | 7/2018 |
| CN | 108428705 A | 8/2018 |
| CN | 108628024 A | 10/2018 |
| CN | 109461405 A | 3/2019 |
| JP | 2004-212486 A | 7/2004 |
| WO | 2020/098200 A1 | 5/2020 |

OTHER PUBLICATIONS

Chinese Office Action in Application No. 201910150824.X dated Jun. 1, 2020 with English translation.
Office Action in U.S. Appl. No. 16/547,820 dated Jun. 29, 2020.
U.S. Office Action in U.S. Appl. No. 17/184,017 dated Jun. 24, 2022.
Office Action in U.S. Appl. No. 16/512,924 dated Apr. 29, 2021.
U.S. Office Action in U.S. Appl. No. 16/638,703 dated Dec. 20, 2021.
English translation of International Search Report of PCT/CN2019/079286, dated Jul. 25, 2019.
English translation of Notice of Transmittal of the International Search Report of PCT/CN2019/079286, dated Jul. 25, 2019.
English translation of Written Opinion of the International Searching Authority of PCT/CN2019/079286, dated Jul. 25, 2019.
Chinese Office Action in Chinese Application No. 201811345869.4, dated Dec. 18, 2019 with English translation.
Chinese Office Action in Chinese Application No. 201811251738.X, dated Jan. 19, 2020 with English translation.
U.S. Office Action in U.S. Appl. No. 17/184,017 dated Dec. 15, 2022.
U.S. Office Action in U.S. Appl. No. 17/212,158 dated Jan. 20, 2023.

* cited by examiner

DISPLAY PANEL AND DISPLAY DEVICE

CROSS REFERENCE TO RELATED APPLICATIONS

This application is a continuation-in-part application of U.S. Ser. No. 16/547,820 filed on Aug. 22, 2019 which claims priority to the Chinese Patent Application No. 201910150824.X, filed on Feb. 28, 2019, which is incorporated herein by reference in its entirety. This application is also a continuation-in-part application of U.S. Ser. No. 16/512,924 filed on Jul. 16, 2019 which claims priority to the Chinese Patent Application No. 201811251738.X, filed on Oct. 25, 2018, which is also incorporated herein by reference in its entirety. This application is also a continuation-in-part application of U.S. Ser. No. 16/638,703 filed on Feb. 12, 2020 which is a national stage application of international application PCT/CN2019/079286 filed on Mar. 22, 2019, which claims priority from CN 201811345869.4 filed on Nov. 13, 2018, which is also incorporated herein by reference in its entirety.

TECHNICAL FIELD

At least one embodiment of the present disclosure relates to a display panel and a display device.

BACKGROUND

With continuous development of the display technology, the augmented reality (AR) technology has a wide application prospect in the fields of games, medical treatment, shopping and so on because of its excellent human-computer interaction experience. The augmented reality technology can provide users with more external world information without affecting the interaction between users and the external world, thereby enhancing the information finally obtained by users.

In general, a device used in the augmented reality technology needs to have a capacity that a part of the device can transmit light while the other part of the device has a display function. Thus, more and more manufacturers are committed to developing transparent display products and using transparent screens to realize the augmented reality technology.

SUMMARY

At least one embodiment of the present disclosure provides a display panel, the display panel comprises a plurality of pixel regions, each of the plurality of pixel regions comprising a pixel island and a transparent region located on a periphery of the pixel island. The pixel island comprises K active display areas, a distance between adjacent ones of the K active display areas in the pixel island is less than a distance between the pixel islands in adjacent ones of the plurality of pixel regions, each of the plurality of pixel regions comprises K sub-regions with approximately equal areas, K pixel driving circuits are respectively disposed in the K sub-regions, the K pixel driving circuits are configured to respectively drive the K active display areas, and the K is an integer greater than or equal to 2.

For example, in a display panel provided by an embodiment of the present disclosure, in the pixel island, the K active display areas are arranged in an array; and in each of the plurality of pixel regions, the K sub-regions are arranged in an array.

For example, in a display panel provided by an embodiment of the present disclosure, in the pixel island, the K active display areas are arranged in a matrix of M*N, the K sub-regions are also arranged in a matrix of M*N, K=M*N, M and N are positive integers respectively, and at least one of M and N is greater than 1.

For example, in a display panel provided by an embodiment of the present disclosure, the pixel island is located in a center of a corresponding pixel region.

For example, in a display panel provided by an embodiment of the present disclosure, each of the K active display area comprises an active light emitting structure.

For example, in a display panel provided by an embodiment of the present disclosure, each of the plurality of pixel regions further comprises: K electrode leads, electrically connecting the K active display areas and the K pixel driving circuits in the transparent region respectively.

For example, in a display panel provided by an embodiment of the present disclosure, the K electrode leads do not cross each other.

For example, in a display panel provided by an embodiment of the present disclosure, each of the K electrode leads comprises a bending electrode lead, the bending electrode lead comprises: a first electrode lead, extending in a direction and connected with a corresponding active display area; and a second electrode lead, extending in another direction different from the direction in which the first electrode lead extends and connecting the first electrode lead with a corresponding pixel driving circuit.

For example, in a display panel provided by an embodiment of the present disclosure, each of the K electrode leads is the bending electrode lead.

For example, in a display panel provided by an embodiment of the present disclosure, each of the plurality pixel regions further comprises: a first signal line and a second signal line connected with each of the K pixel driving circuits.

For example, in a display panel provided by an embodiment of the present disclosure, the first signal line comprises at least one of a gate line and a reset line, and the second signal line comprises at least one of a data line and a source line.

For example, in a display panel provided by an embodiment of the present disclosure, each of the K pixel driving circuits is disposed in a position of a corresponding sub-region away from the pixel island.

For example, in a display panel provided by an embodiment of the present disclosure, an area of each of the K sub-regions is greater than that of each of the K pixel driving circuits.

For example, in a display panel provided by an embodiment of the present disclosure, each of the K pixel driving circuits comprises a thin film transistor.

For example, in a display panel provided by an embodiment of the present disclosure, the K pixel driving circuits are in the transparent region.

For example, in a display panel provided by an embodiment of the present disclosure, the distance between adjacent ones of the K active display regions in the pixel island is less than one third of the distance between the pixel islands in adjacent ones of the plurality of pixel regions.

For example, in a display panel provided by an embodiment of the present disclosure, in each of the plurality of pixel regions, positions of the K pixel driving circuits in corresponding sub-pixel regions are the same.

For example, in a display panel provided by an embodiment of the present disclosure, in the plurality of pixel regions, adjacent ones of the plurality of pixel regions are connected to each other so that the plurality of pixel regions are closely arranged.

For example, in a display panel provided by an embodiment of the present disclosure, the pixel island partially overlaps with the sub-pixel regions adjacent to the pixel island.

At least one embodiment of the present disclosure further provides a display device, comprising the display panel in any embodiment of the present disclosure.

BRIEF DESCRIPTION OF THE DRAWINGS

In order to more clearly illustrate technical solutions of embodiments of the present disclosure, drawings of the embodiments will be briefly described in the following. It is obvious that the described drawings in the following description are only related to some embodiments of the present disclosure, but are not limitative to the present disclosure.

DETAILED DESCRIPTION

In order to make objects, technical details and advantages of the embodiments of the present disclosure apparently, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, a person having ordinary skill in the art may obtain other embodiment(s), without any inventive work, which should be within the scope of the disclosure.

Unless otherwise defined, the technical terms or scientific terms used herein have the same meanings as commonly understood by one of ordinary skill in the art to which the present disclosure belongs. The terms "first", "second", etc., which are used in the description and the claims of the present disclosure, are not intended to characterize any sequence, amount or importance, but distinguish various components. The terms "includes", "comprising", etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Figure 1:
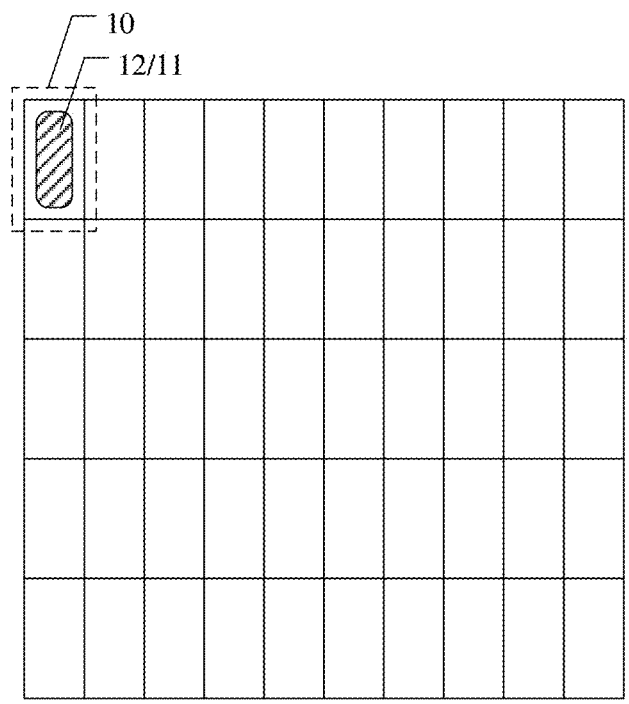
FIG. 1 is a planar view of a display panel.

FIG. 1 is a planar view of a display panel. As illustrated in FIG. 1, the display panel comprises a plurality of pixel regions 10, each pixel region 10 comprises an active display area 12 for light emitting display, and the active display area 12 can be regarded as a light emitting point 11. The active display area 12 occupies most of an area of the pixel region 10 and is surrounded by structures such as an opaque signal lines and a black matrix. Thus, the display panel does not have a capacity of partially transmitting light and is not suitable for the augmented reality technology.

Figure 2:
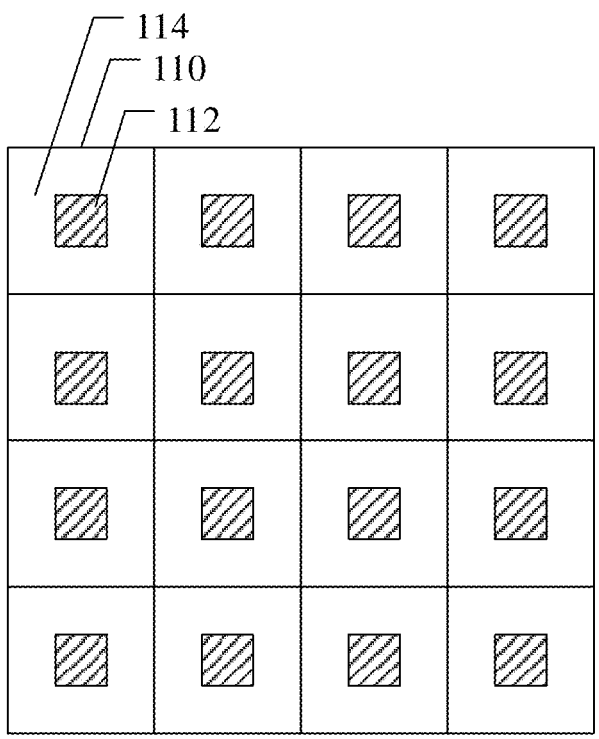
FIG. 2 is a planar view of another display panel.

FIG. 2 is a planar view of another display panel. As illustrated in FIG. 2, the display panel comprises a plurality of pixel regions 110, and each pixel region 110 comprises a pixel island 112 and a transparent region 114 located in a periphery of the pixel island 112. The pixel island 112 can be used for light emitting display, and the transparent region 114 has a capacity of transmitting light, therefore, the display panel can be suitable for the augmented reality technology, but is not limited thereto. In general, the display panel is an active light emitting display panel, such as an organic light emitting diode (OLED) display panel. OLED has a problem of non-uniform threshold voltage, and a pixel driving circuit of a general OLED display panel needs to have a threshold voltage compensation function, which may result in that the pixel driving circuit of the OLED display panel comprises a plurality of components, for example, a plurality of switching transistors, capacitors and signal lines. Thus, a space occupied by the pixel driving circuit of the OLED display panel may be significantly increased, and even the area of the pixel driving circuit of the OLED display panel may be greater than that of the active display area.

Figure 3:
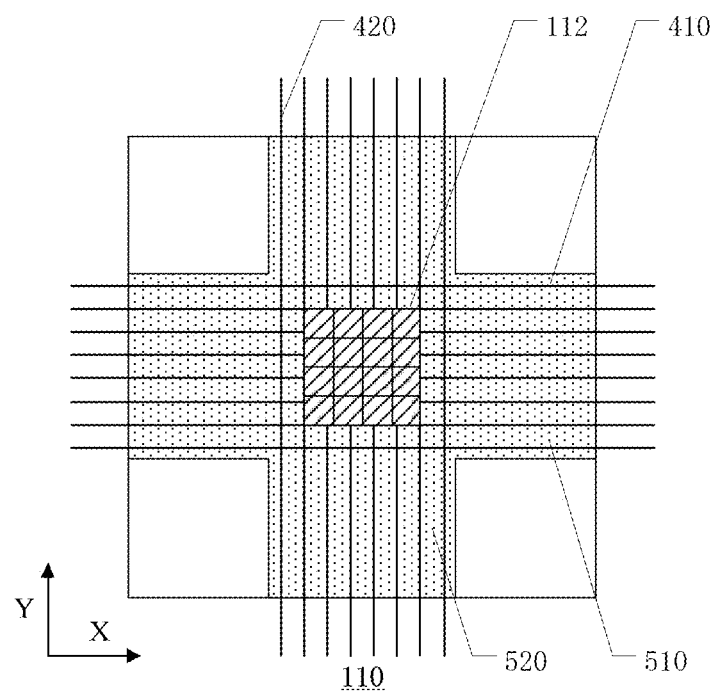
FIG. 3 is a planar view of one pixel region of the display panel illustrated in FIG. 2.

FIG. 3 is a planar view of one pixel region of the display panel illustrated in FIG. 2. As illustrated in FIG. 3, in the pixel region 110, the pixel island 112 comprises 16 active display areas as light emitting points, and the 16 active display areas are arranged in a matrix of 4*4. In this case, in order to drive the 16 active display areas in the pixel island 112 to emit light respectively, 16 pixel driving circuits electrically connected to the 16 active display areas are needed to drive the 16 active display areas to emit light respectively. An area of each pixel driving circuit is greater than that of each active display area, therefore, an area of the 16 pixel driving circuits is greater than an area of the pixel island 112. On the other hand, in order to drive the 16 active display areas in the pixel island 112 to emit light respectively, each pixel driving circuit needs to connect a horizontal signal line 410 extending in X direction and a vertical signal line 420 extending in Y direction in FIG. 3. Therefore, horizontal signal lines 410 of the 16 pixel driving circuits can form a horizontal signal line region 510, and vertical signal lines 420 of the 16 pixel driving circuits can form a vertical signal line region 520. The horizontal signal line region 510 and the vertical signal line region 520 can form a cross-shaped region. As illustrated in FIG. 3, in the horizontal signal line region and the vertical signal line region (the cross-shaped region illustrated in FIG. 3), density of opaque signal lines is relatively high, resulting in poor light transmittance of the horizontal signal line region and the vertical signal line region.

Figure 4:
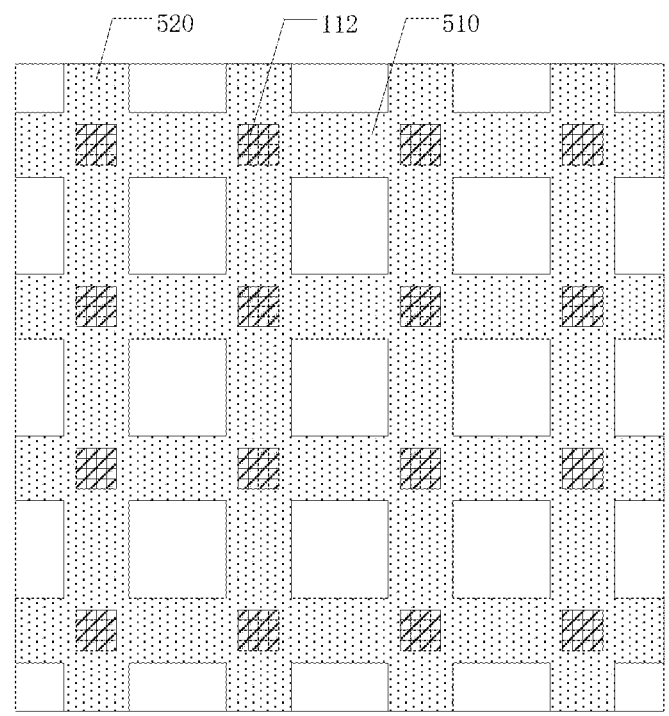
FIG. 4 is a schematic view of a horizontal signal line region and a vertical signal line region in a display panel.

FIG. 4 is a schematic view of a horizontal signal line region and a vertical signal line region in a display panel. As illustrated in FIG. 4, in a case where the display panel displays, especially the display panel is used as a near-eye display panel for displaying, the horizontal signal line region and the vertical signal line region have poor light transmittance, therefore, an obvious mesh-like dark region is easily formed on the display panel, thereby causing an obvious screen window effect, and further causing a poor display effect and a poor user experience.

Thus, embodiments of the present disclosure provide a display panel and a display device. The display panel comprises a plurality of pixel regions, each pixel region comprising a pixel island and a transparent region located on a periphery of the pixel island. The pixel island comprises K active display area, a distance between adjacent ones of the K active display area in the pixel island is less than a distance between pixel islands of adjacent ones of the plurality of pixel regions. Each of the plurality of pixel regions comprises K sub-regions with approximately equal areas, K pixel driving circuits are respectively disposed in the K sub-regions, the K pixel driving circuits are configured to respectively drive the K active display areas, and the K is an integer greater than or equal to 2. In the display panel, the K pixel driving circuits of the K active display areas in the pixel island of the pixel region are uniformly distributed in the pixel region, so that signal lines connected with pixel driving circuits are also uniformly distributed in the pixel region, thereby avoiding the formation of the abovementioned horizontal signal line region and the vertical signal line region having poor light transmittance, and improving the uniformity of light transmittance in the pixel region, so as to eliminate the screen window effect as mentioned above, improve the display effect and enhance the user experience.

A display panel and a display device provided by embodiments of the present disclosure are described below with reference to the drawings.

Figure 5A:
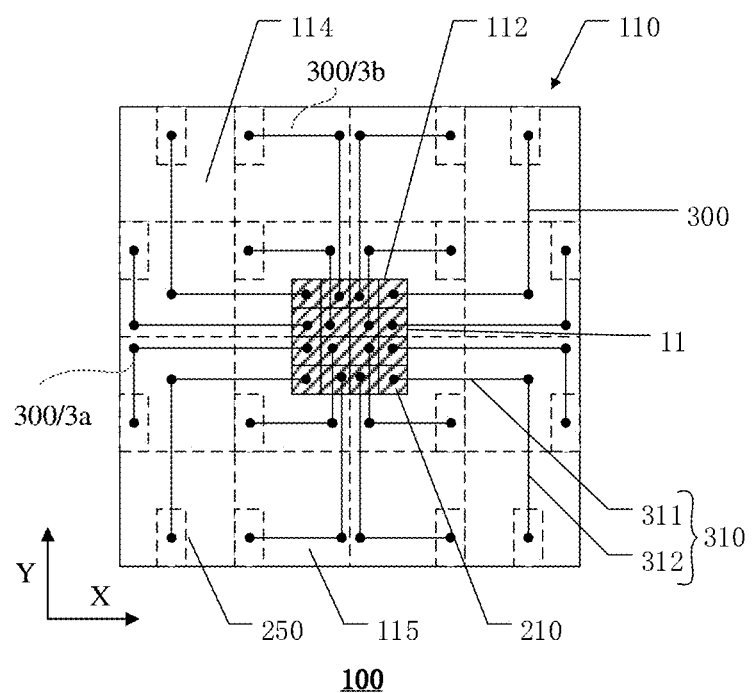
FIG. 5A is a planar view of a display panel provided by an embodiment of the present disclosure.

An embodiment of the present disclosure provides a display panel. FIG. 5A is a planar view of a display panel according to an embodiment of the present disclosure. The display panel 100 comprises a plurality of pixel regions 110, the plurality of pixel regions 110 can be closely arranged to form a display region of the display panel 100. For example, adjacent pixel regions are connected with each other so that they can be closely arranged. In order to clearly illustrate a structure within the pixel region, FIG. 5A only illustrates one pixel region 110. As illustrated in FIG. 5A, each pixel region 110 comprises a pixel island 112 and a transparent region 114 located in a periphery of the pixel island 112. The pixel island 112 comprises K active display areas 210, a distance between adjacent active display areas 210 in the pixel island 112 is less than a distance between pixel islands 112 in adjacent pixel regions 110. The pixel region 110 comprises K sub-regions 115 with approximately equal areas, K pixel driving circuits 250 are respectively disposed in the K sub-regions 115, the K pixel driving circuits 250 are configured to respectively drive the K active display areas 210 as mentioned above to emit light, and the K is an integer greater than or equal to 2. For example, each active display area 210 corresponds to one pixel driving circuit 250. It should be noted that, the abovementioned each active display area and the corresponding pixel driving circuit can form a minimum unit emitting light independently, such as a sub-pixel. The above mentioned "approximately equal" means that a difference in areas of different sub-regions does not exceed 20% of an average area of the sub-region. Furthermore, the distance between adjacent active display areas 210 in the pixel island 112 illustrated in FIG. 5A is zero, the embodiments of the present disclosure include but are not limited thereto, the distance between adjacent active display areas 210 in the pixel island 112 may not be zero, as long as the distance between adjacent active display areas 210 in the pixel island 112 is less than the distance between the pixel islands 112 in adjacent pixel regions 110. Because the plurality pixel regions 110 can be closely arranged to form a display region of the display panel, the distance between adjacent pixel islands may be twice a minimum distance between the pixel island and an edge of the pixel region where the pixel island is located. For example, in some embodiments, the transparent region 114 is a light-transmitting region, but is not limited thereto.

For example, in some examples, the pixel island 112 is partially overlapped with the sub-regions adjacent to the pixel island 112. For example, as illustrated in FIG. 5A, the pixel island 112 partially overlaps with four sub-regions in the middle, but the embodiments according to the present disclosure are not limited thereto.

In the display panel provided by the embodiment, each pixel region 110 comprises the pixel island 112 and the transparent region 114, the pixel island 112 is provided with the active display area 210 for emitting light and displaying, and the transparent region 114 is not provided with the active display area 210, and is a light-transmitting region. Therefore, the pixel island 112 of the display panel can be used to emit light and display, and the transparent region 114 can transmit light, so that a user can observe a real scene on a side of the display panel away from the user. The display panel can be used in a field of augmented reality, but is not limited thereto. The pixel region 110 comprises the K sub-regions 115 with approximately equal areas, the K pixel driving circuits 250 are respectively disposed in the K sub-regions 115, therefore, the K pixel driving circuits 250 of the K active display areas 210 in the pixel island 112 of the pixel region 110 are uniformly distributed in the pixel region 110, so that signal lines connected with the pixel driving circuits 250 are also uniformly distributed in the pixel region 110, thereby avoiding the formation of a signal line concentrated region having poor light transmittance, and improving the uniformity of light transmittance in the pixel region, so as to eliminate the screen window effect, improve the display effect and enhance the user experience.

Furthermore, the pixel driving circuit 250 can be disposed outside the pixel island, therefore, the active display area 210 in the pixel island 112 can be made smaller, so that the pixel island 112 with the same area can be provided with more active display areas, so as to be beneficial to improve the resolution or PPI (Pixel Per Inch) of the display panel.

It should be noted that, the sub-regions in the embodiment of the present disclosure are actually the division of the area of each pixel region, and are defined only for uniform distribution of the K pixel driving circuits of the K active display regions in the pixel region. Therefore, the sub-region can be the transparent region, and can also be the pixel island, or a portion of the sub-region is the transparent region, and another portion of the sub-region is the pixel island.

For example, in some examples, as illustrated in FIG. 5A, in each pixel island 112, the K active display areas 210 are arranged in an array. In each pixel region 110, the K sub-regions 115 are also arranged in an array. That is, the K active display regions 210 are distributed in the K sub-regions 115 arranged in an array, thereby further improving the uniformity of light transmittance in the pixel region, and eliminating the screen window effect, improving the display effect and enhancing the user experience.

For example, in some examples, the display panel can be an active light emitting display panel, each active display area comprises an active light emitting structure, such as an organic light emitting diode. Because the active light emitting structure does not need a backlight module, the structure of the display panel is simpler and the manufacturing cost is relatively low. It should be noted that, the active display panel provided by the embodiment of the present disclosure is not limited to organic light emitting diode display panel, but may also be other types of display panels, such as an electronic paper display panel.

Figure 16:
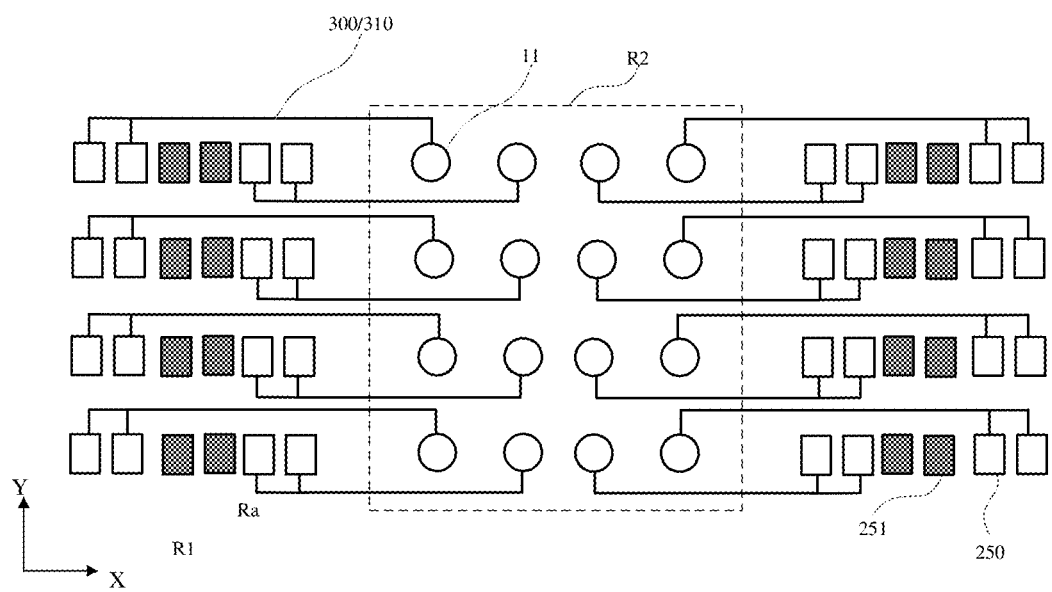

For example, in some examples, the K active display regions 210 in each pixel island 112 are arranged in a matrix of M*N, and the K sub-regions 115 are also arranged in a matrix of M*N, K=M*N. For example, as illustrated in FIG. 5A, 16 active display areas are arranged in a matrix of 4*4, 16 sub-regions 115 are also arranged in a matrix of 4*4. M and N are positive integers respectively, and at least one of M and N is greater than 1.

For example, in some examples, a matrix arrangement direction of the active display areas 210 in each pixel island 112 is the same as that of the K sub-regions 115. For example, taking the matrix arrangement of M*N as an example, each row of the active display areas 210 comprises M active display areas, each column of the active display areas 210 comprises N active display areas, each row of the sub-regions 115 comprises M sub-regions, and each column of the sub-regions 115 comprises N sub-regions. The row direction of the active display area matrix is the same as the row direction of the sub-region matrix, and the column direction of the active display area matrix is the same as the column direction of the sub-region matrix.

Figure 5B:
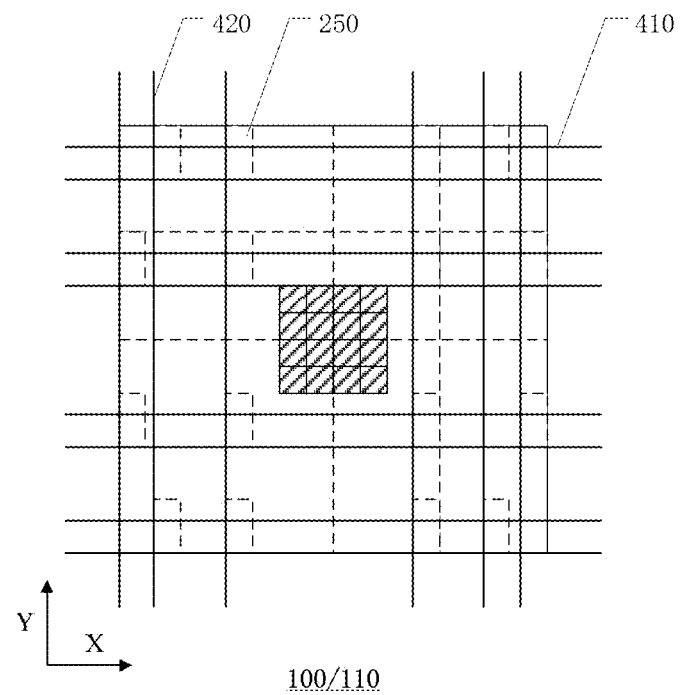
FIG. 5B is a distribution view of a first signal line and a second signal line of the display panel illustrated in FIG. 5A.

FIG. 5B is a distribution view of a first signal line and a second signal line in the display panel illustrated in FIG. 5A. As illustrated in FIG. 5B, the pixel region 110 further comprises a first signal line 410 and a second signal line 420 connected with each pixel driving circuit 250. As illustrated in FIG. 5B, because the K pixel driving circuits 250 of the K active display areas 210 in the pixel island 112 are uniformly distributed in the pixel region 110, so that the first signal line 410 and the second signal line 420 connected with the pixel driving circuits 250 are also uniformly distributed in the pixel region 110, thereby preventing the formation of a signal line concentrated region with poor light transmittance due to the excessively concentrated distribution of the first signal line 410 and the second signal line 420. Therefore, the display panel can improve the uniformity of light transmittance in the pixel region, so as to eliminate the screen window effect, improve the display effect and enhance the user experience.

For example, the first signal line 410 comprises at least one of a gate line and a reset line, and the second signal line 420 comprises at least one of a data line and a source line. Certainly, the embodiment of the present disclosure includes but is not limited thereto, the first signal line 410 and the second signal line 420 can also be other signal lines, which may be specifically set according to actual conditions.

For example, an extending direction of the first signal line 410 and an extending direction of the second signal line 420 cross each other. For example, the extending direction of the first signal line 410 and the extending direction of the second signal line 420 are perpendicular to each other.

For example, in some examples, as illustrated in FIG. 5A, each pixel island 112 is located in a center of the corresponding pixel region 110. Thus, the K pixel driving circuits corresponding to the K active display areas in the pixel island 112 can be uniformly dispersed around the pixel island 112. On one hand, the arrangement can improve the uniformity of light transmittance of the pixel region; on the other hand, the arrangement can reduce the density of electrode leads between the active display area in the pixel island and the corresponding pixel driving circuit, and reduce the wiring difficulty.

For example, in some examples, as illustrated in FIG. 5A, the pixel driving circuit 250 is disposed in the sub-region 115 at a position away from the pixel island 112, so as to further improve the uniformity of the light transmittance in the pixel region.

For example, in some examples, as illustrated in FIG. 5A, an area of each sub-region 115 is greater than that of each pixel driving circuit 250.

For example, in some examples, as illustrated in FIG. 5A, each pixel driving circuit 250 comprises a thin film transistor. Certainly, the pixel driving circuit 250 can also comprise other electronic components such as a capacitor.

For example, in some examples, the K pixel driving circuits 250 are located in the transparent region 114. A specific position of each pixel driving circuit 250 can be set according to the actual situation.

For example, in some examples, the distance between adjacent active display areas 210 in the pixel island 112 is less than one third of the distance between the pixel islands 112 in adjacent pixel regions 110.

For example, in some examples, as illustrated in FIG. 5A, each pixel region 110 further comprises: K electrode leads 300, connecting to the K active display areas 210 respectively, and connecting the K active display areas 210 and the K pixel driving circuits 250 in the transparent region 114, so as to ensure that each pixel driving circuit 250 can drive the corresponding active display area 210 to emit light and display.

For example, in some examples, as illustrated in FIG. 5A, the K electrode leads 300 are not cross each other, thereby facilitating wiring.

For example, in some examples, as illustrated in FIG. 5A, the K electrode leads 300 comprise a bending electrode leads 310, the bending electrode leads 310 comprises: a first electrode lead 311, extending in a direction and connected with a corresponding active display area 310; and a second electrode lead 312, extending in another direction different from the direction in which the first electrode lead 311 and connecting the first electrode lead 311 with a corresponding pixel driving circuit 250. Thus, the distribution density of the bending electrode leads 310 can be reduced to prevent the bending electrode leads 310 from being concentrated to form a region with low light transmittance.

For example, in some examples, the K electrode leads are not overlapped with each other.

For example, in some examples, the extending direction of the first electrode lead 311 of the bending electrode leads 310 is the same as the row direction of the sub-region matrix, and the extending direction of the second electrode lead 312 of the bending electrode leads 310 is the same as the column direction of the sub-region matrix. However, the embodiments of the disclosure are not limited thereto. For example, the extending direction of the first electrode lead 311 of the bending electrode leads 310 is the same as the column direction of the sub-region matrix, and the extending direction of the second electrode lead 312 of the bending electrode leads 310 is the same as the row direction of the sub-region matrix.

For example, in some examples, as illustrated in FIG. 5A, the extending direction of the first electrode lead 311 is perpendicular to the extending direction of the second electrode lead 312.

For example, in some examples, as illustrated in FIG. 5A, each of the K electrode leads is the bending electrode lead 310.

Figure 6:
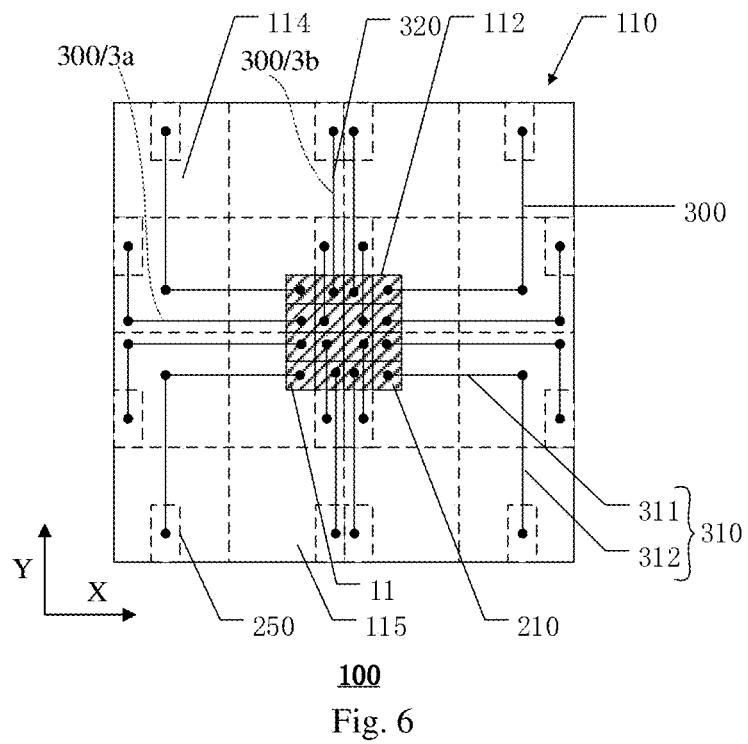
FIG. 6 is a planar view of another display panel provided by an embodiment of the present disclosure.

FIG. 6 is a planar view of another display panel provided by an embodiment of the present disclosure. As illustrated in FIG. 6, a portion of the K electrode leads 300 is the bending electrode lead 310. For example, as illustrated in FIG. 6, the K electrode leads 300 further comprises electrode leads extending in Y direction as illustrated in FIG. 6, so as to directly connect the active display areas to corresponding pixel driving circuits. Although the electrode leads extending in Y direction in the display panel are relatively concentrated, the pixel driving circuits are dispersed in the pixel region, signal lines connected to the pixel driving circuits are also uniformly distributed in the pixel region. Therefore, the display panel can still better avoid the formation of the abovementioned signal line concentrated region having poor light transmittance, and improve the uniformity of light transmittance in the pixel region, so as to eliminate the screen window effect, improve the display effect and enhance the user experience.

Figure 7:
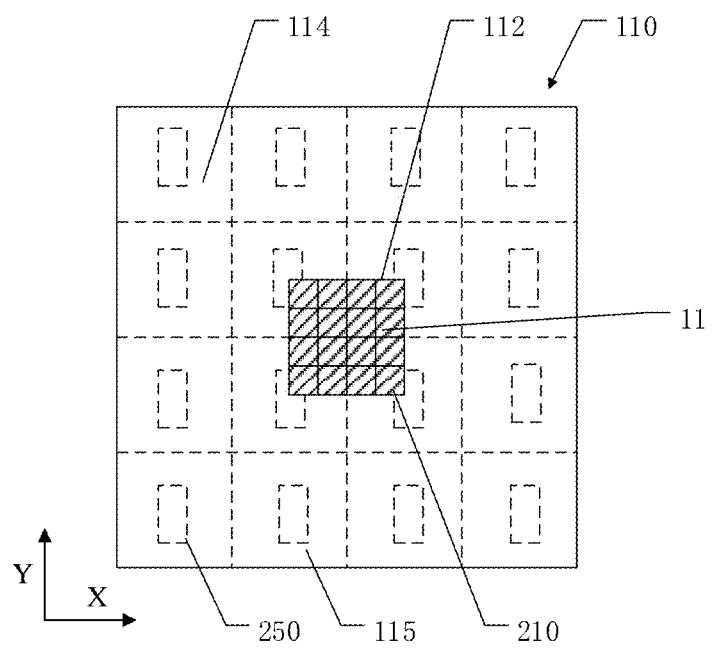
FIG. 7 is a planar view of another display panel provided by an embodiment of the present disclosure.
Figure 8:
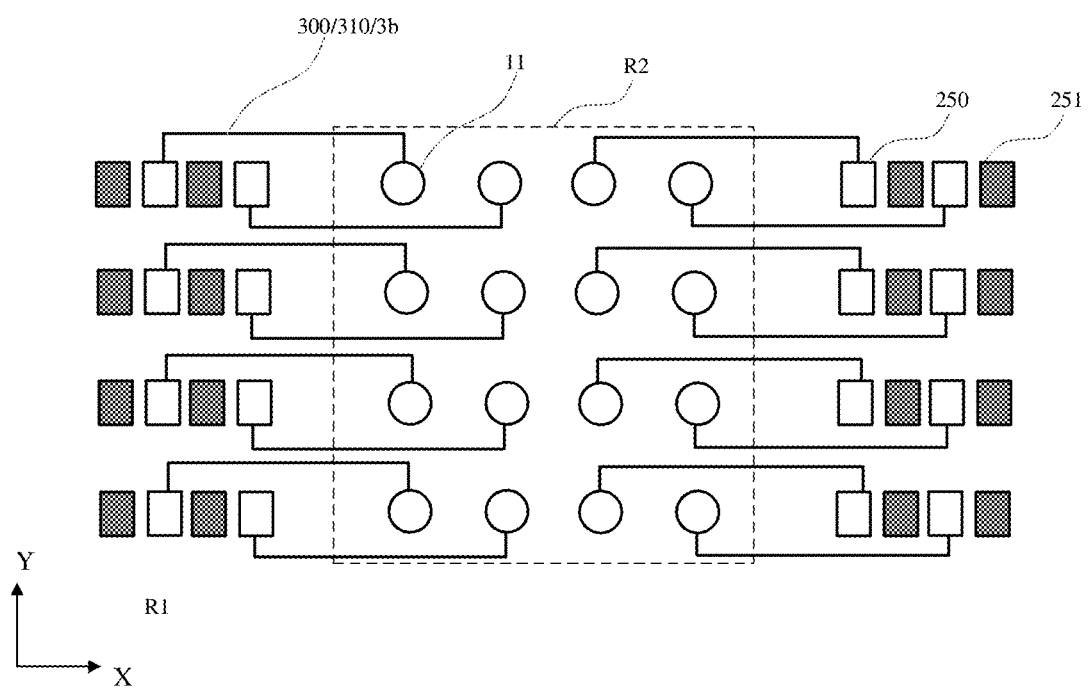
FIGS. 8-12 are schematic diagrams of display panels provided by embodiments of the present disclosure.

FIG. 7 is a planar view of another display panel provided by an embodiment of the present disclosure. As illustrated in FIG. 7, the display panel 100 differs from the display panel illustrated in FIG. 5A and FIG. 6 in that positions of the pixel driving circuits 250 in respective sub-regions 115 in the embodiment are the same. The position here refers to a relative position of the pixel driving circuit in the corresponding sub-region. For example, each pixel driving circuit 250 is disposed in the middle of the corresponding sub-region, the embodiment includes but is not limited thereto. For the display panel illustrated in FIG. 7, because the pixel driving circuits are uniformly distributed, the distribution of the first signal line and the second signal line may be more uniform. For simplicity, FIG. 7 does not illustrate the electrode leads between the active display areas and the pixel driving circuits, but corresponding electrode leads can be designed to perform corresponding electrical connections.

Figure 13:
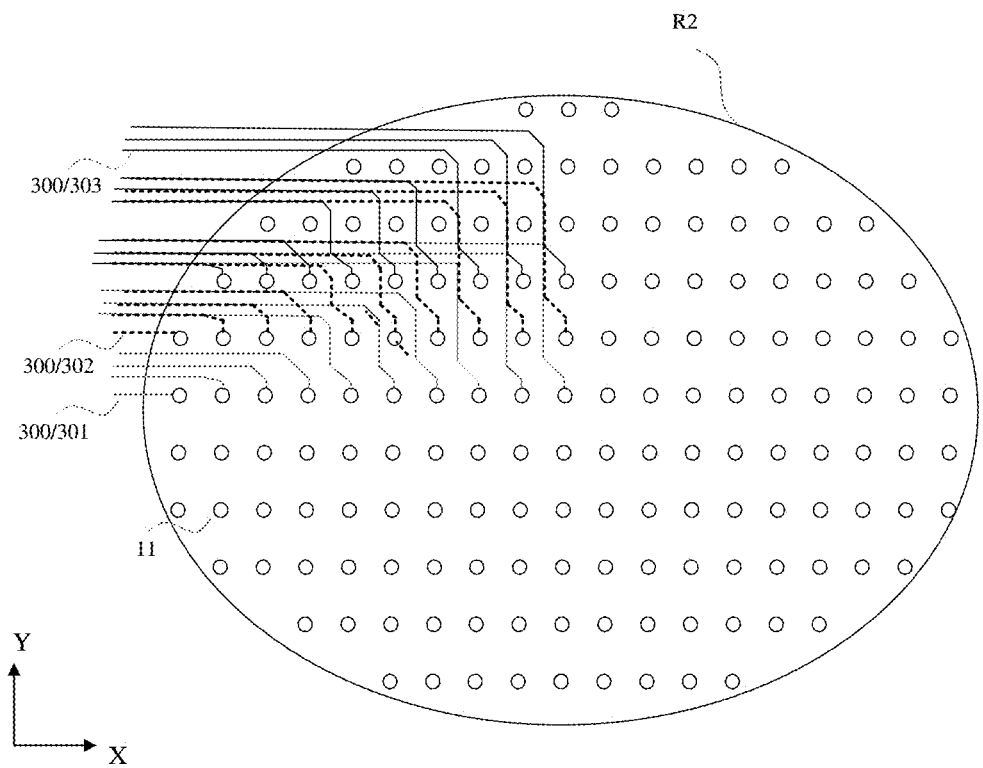
FIG. 13 is a schematic diagram of a display panel provided by an embodiment of the present disclosure.
Figure 14:
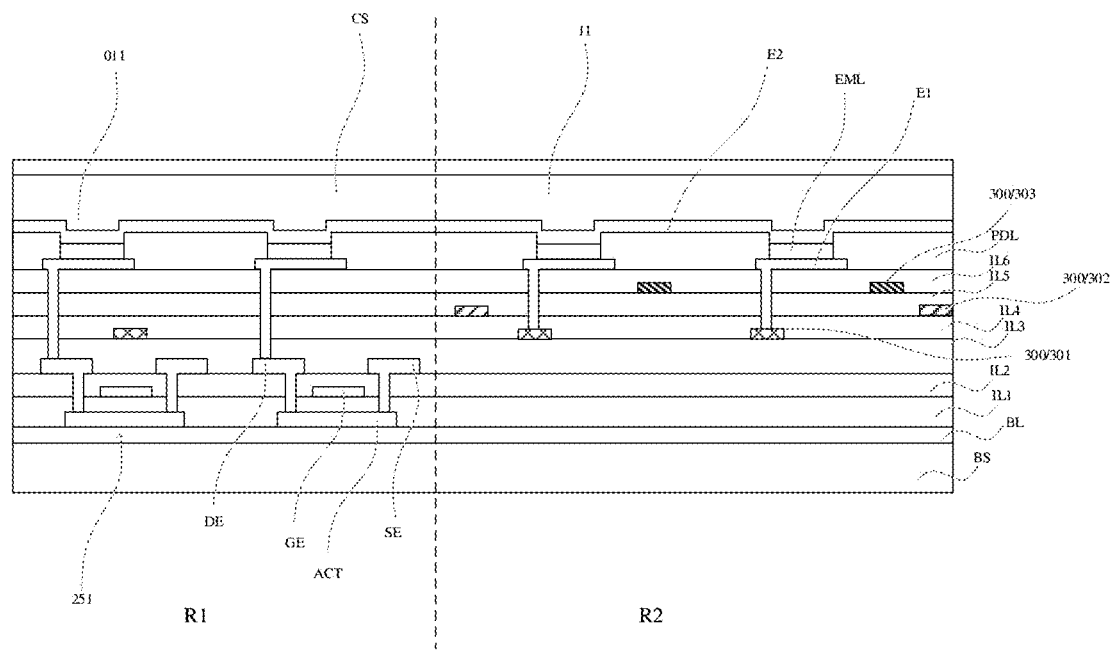
FIG. 14 is a sectional view of a display panel provided by an embodiment of the present disclosure.
Figure 15:
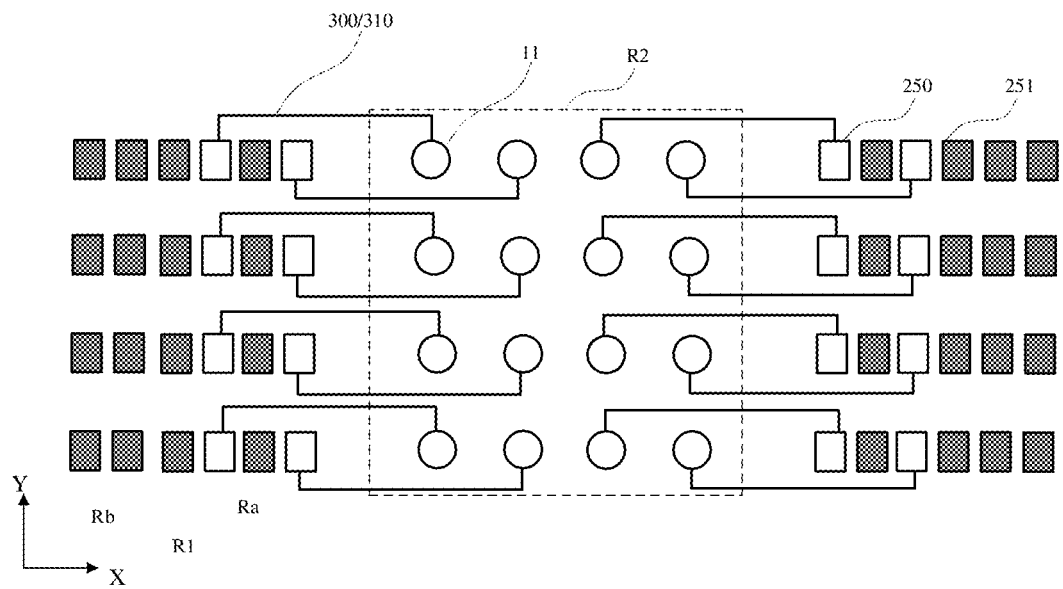
FIGS. 15-18 are schematic diagrams of display panels provided by embodiments of the present disclosure.
Figure 19A:
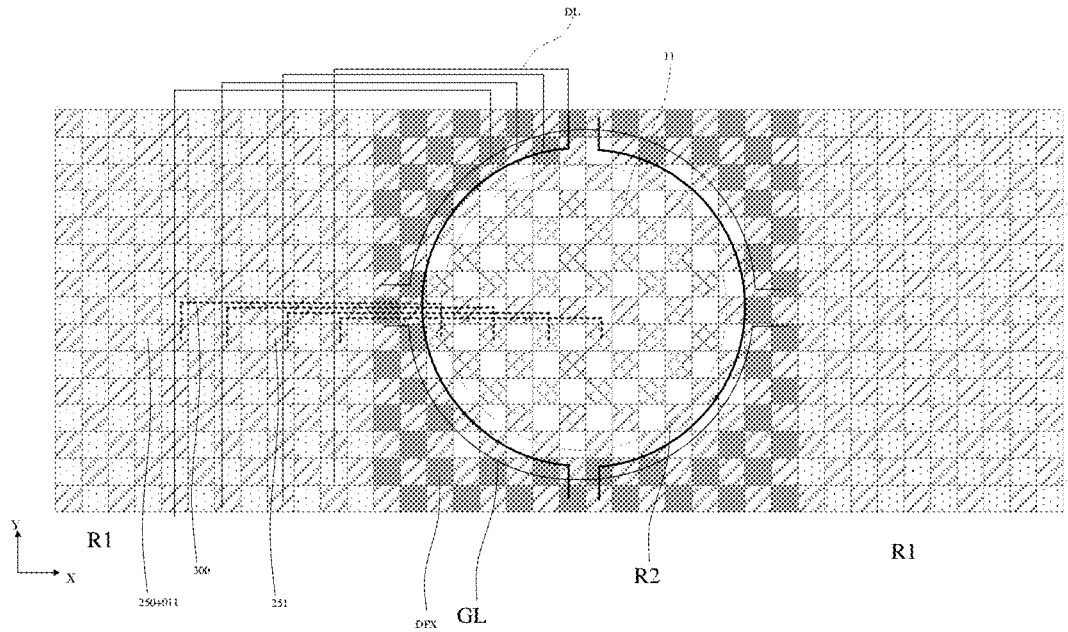
FIG. 19A is a schematic diagram of a display panel provided by an embodiment of the present disclosure.
Figure 19B:
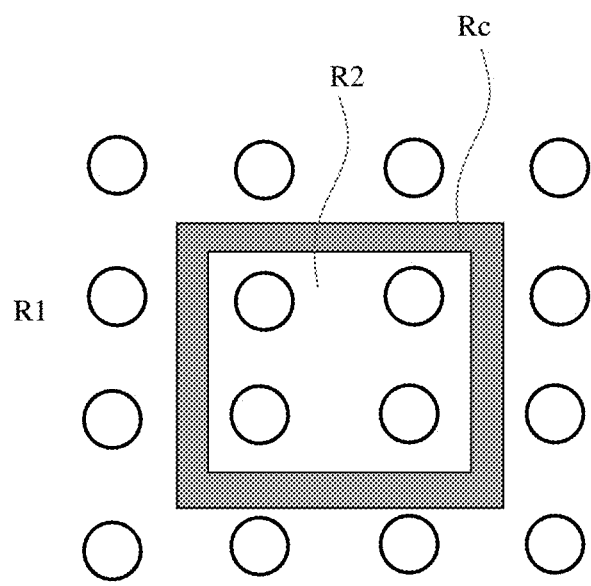
FIG. 19B is a schematic diagram of a display panel provided by an embodiment of the present disclosure.
Figure 20:
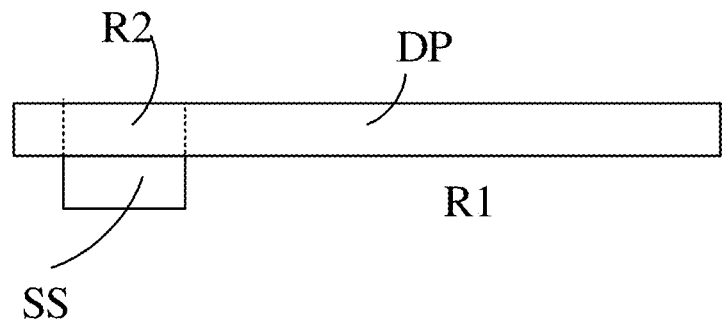
FIG. 20 is a schematic diagram of a display device provided by embodiments of the present disclosure.

FIGS. 8-12 are schematic diagrams of display panels provided by embodiments of the present disclosure. FIG. 13 is a schematic diagram of a display panel provided by an embodiment of the present disclosure. FIG. 14 is a sectional view of a display panel provided by an embodiment of the present disclosure. FIGS. 15-18 are schematic diagrams of display panels provided by embodiments of the present disclosure. FIG. 19A is a schematic diagram of a display panel provided by an embodiment of the present disclosure. FIG. 19B is a schematic diagram of a display panel provided by an embodiment of the present disclosure. FIG. 20 is a schematic diagram of a display panel provided by an embodiment of the present disclosure.

As illustrated in FIG. 5A, FIG. 6, FIGS. 8-12 and FIGS. 15-18, the display panel includes: a plurality of light emitting points 11; a plurality of pixel driving circuits 250, and a plurality of electrode leads 300; at least one of the plurality of light emitting points 11 is connected to at least one of the plurality of pixel driving circuits 250; and the at least one of the plurality of light emitting points 11 is connected to the at least one of the plurality of pixel driving circuits 250 through at least one of the plurality of electrode leads 300. For example, in some embodiments, one of the plurality of light emitting points 11 is connected to one of the plurality of pixel driving circuits 250 through one of the plurality of electrode leads 300. For example, in some embodiments, two or more than two of the plurality of light emitting points 11 is connected to one of the plurality of pixel driving circuits 250 through at least one of the plurality of electrode leads 300. For example, in some embodiments, one of the plurality of light emitting points 11 is connected to two or more than two of the plurality of pixel driving circuits 250 through at least one of the plurality of electrode leads 300. For example, as illustrated in FIG. 5A, FIG. 6, FIGS. 8-12 and FIGS. 15-18, the plurality of pixel driving circuits 250 are separated from the plurality of light emitting points 11. For example, the plurality of pixel driving circuits 250 are spaced apart from the plurality of light emitting points 11.

For example, an orthographic projection of the light emitting point 11 does not overlap with an orthographic projection of the pixel driving circuit 250 connected to the light emitting point 11.

In the display panel provided by one or more embodiments of the present disclosure, by separating the plurality of pixel driving circuits 250 from the plurality of light emitting points 11, the transmittance of the display panel can be improved, the diffraction of the light can be reduced so as to prevent glare, thereby increasing the display effect of the display panel.

For example, as illustrated in FIGS. 8-12 and FIGS. 15-18, the display panel may include a first region R1 and a second region R2, the second region R2 is at least located at one side of the first region R1. For example, the second region R2 is surrounded by the first region R1, which is not limited thereto. For example, as illustrated in FIGS. 8-12 and FIGS. 15-18, the second region R2 is provided with the light emitting points 11, but is not provided with any pixel driving circuit, the pixel driving circuit that is used for driving the light emitting point located in the second region R2 is not located in the second region R2, but is located in the first region R1. For example, the first region R1 is a display region, and light cannot transmit through the first region R1, and the second region R2 is a display and light-transmitting region, the first region R1 and the second region R2 are cooperated to display an image.

Compared with the case where the pixel driving circuit for driving the light emitting point is located in the second region, because no pixel driving circuit 250 is arranged in the second region R2, the display panel provided by the embodiments of the present disclosure can obtain high transmittance. For example, the second region R2 is provided with the light emitting point 11 and a part of the electrode lead 300.

According to the display panel provided by one or more embodiments of the present disclosure, as illustrated in FIGS. 8-12 and FIGS. 15-18, the display panel further includes a plurality of in situ pixel driving circuits 251, the plurality of pixel driving circuits 250 are distributed at intervals between the plurality of in situ pixel driving circuits 251. For example, the light emitting point 11 is in the same row or in the same column as the pixel driving circuit 250 connected thereto, but is not limited thereto. For example, at least one in situ pixel driving circuits 251 is provided between two adjacent pixel driving circuits 250 of the same row or of the same column. The numbers of the in situ pixel driving circuits 251 arranged between two adjacent pixel driving circuits 250 can be provided as required. For example, as illustrated in in FIG. 5A, FIG. 6, FIGS. 8-12 and FIGS. 15-18, an orthographic projection of the pixel driving circuit 250 on the substrate does not overlap with an orthographic projection of the light emitting point 11 on the substrate. For example, an orthographic projection of the pixel driving circuit 250 on the substrate does not overlap with an orthographic projection of the light emitting point 11 that is connected to the pixel driving circuit 250 on the substrate.

According to the display panel provided by one or more embodiments of the present disclosure, as illustrated in FIG. 5A, FIG. 6 and FIGS. 8-12, in a plan view of the display panel, an interval is provided between one of plurality of light emitting points 11 and the pixel driving circuit 250 connected thereto. For example, light emitting point 11 is connected to the pixel driving circuit 250 through the electrode lead 300.

According to the display panel provided by one or more embodiments of the present disclosure, the plurality of pixel driving circuits 250 are located in a first region, the plurality of light emitting points are located in a second region R2, the first region R1 is located outside the second region R2, the plurality of pixel driving circuits 250 are located outside the second region R2 where the plurality of light emitting points are located.

As illustrated in FIGS. 8-12 and FIGS. 15-18, a first direction Y and a second direction X are shown, for example, the first direction Y intersects with the second direction X. For further example, the first direction Y is perpendicular to the second direction X. The embodiment of the present disclosure are described with reference to the case where the first direction Y is a vertical direction and the second direction X is a horizontal direction, by way of example. For example, the first direction Y is a column direction, and the second direction X is a row direction.

According to the display panel provided by one or more embodiments of the present disclosure, as illustrated in FIGS. 8-12 and FIGS. 15-18, the electrode lead 300 goes beyond the second region R2. For example, the electrode lead 300 extends from the second region R2 to the first region R1. In other words, the electrode lead 300 extends from the first region R1 to the second region R2.

Figure 9:
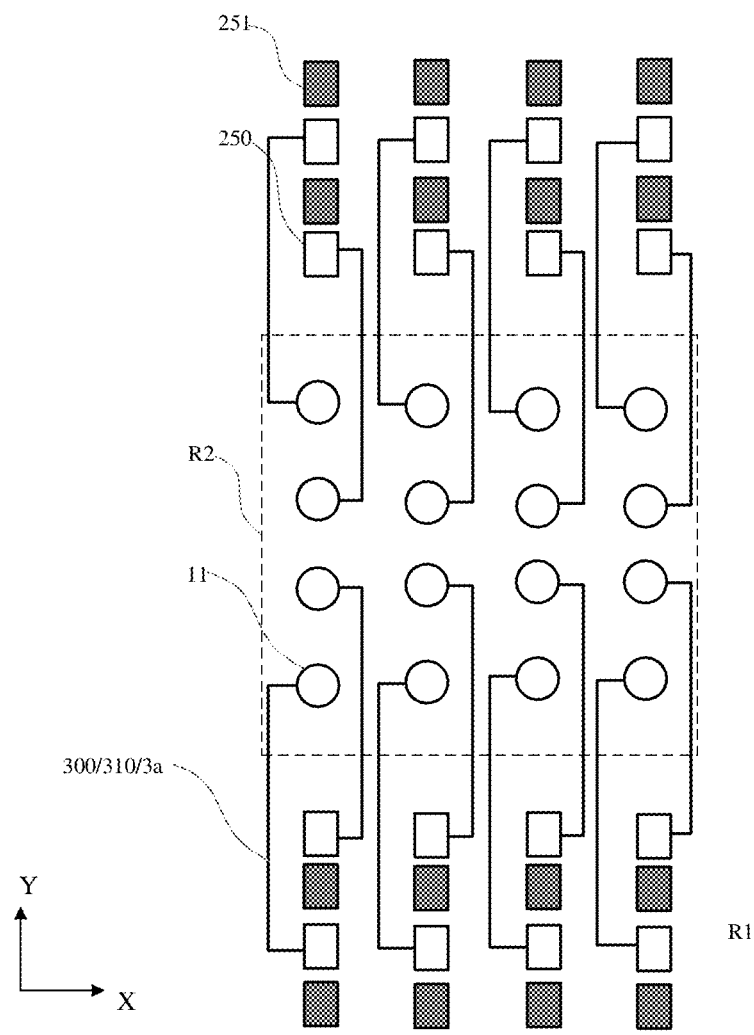
Figure 10:
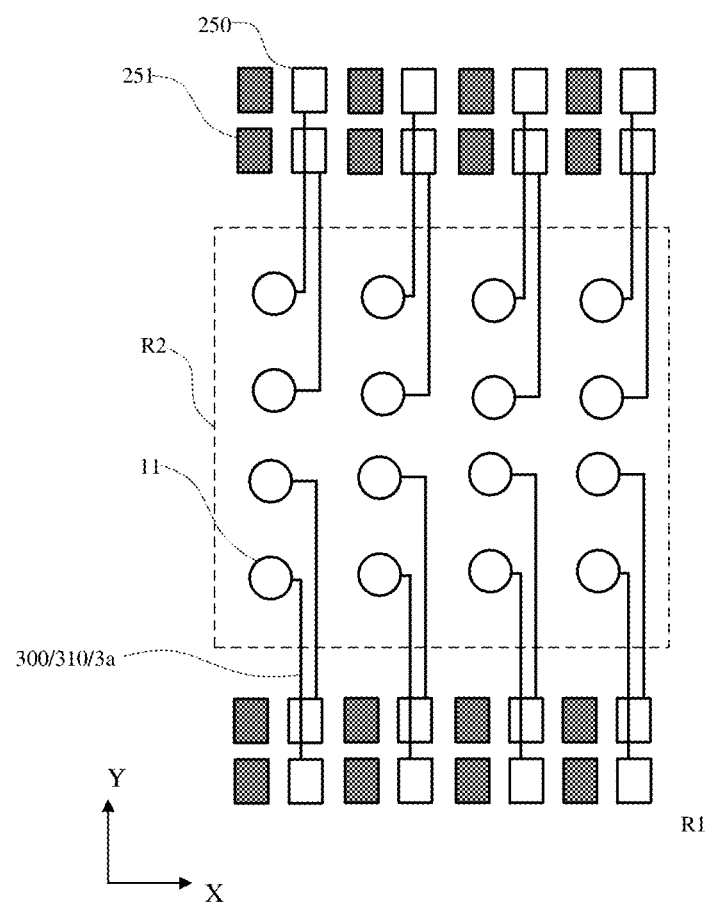

According to the display panel provided by one or more embodiments of the present disclosure, as illustrated in FIG. 9 and FIG. 10, at least one of the plurality of electrode leads 300 extends in a first direction Y.

According to the display panel provided by one or more embodiments of the present disclosure, as illustrated in FIG. 5A, FIG. 6, FIG. 8, FIG. 13, and FIGS. 15-18, at least one of the plurality of electrode leads 300 extends in a second direction X.

In the embodiment of the present disclosure, an extending direction of the electrode lead refers to an extending trend of the electrode lead, maybe some parts of the electrode lead does not extends in the mentioned direction, for example, most parts of the electrode lead extend in the direction, or, a line from a starting end of the electrode lead to the finishing end of the electrode lead extends in the direction.

Figure 12:
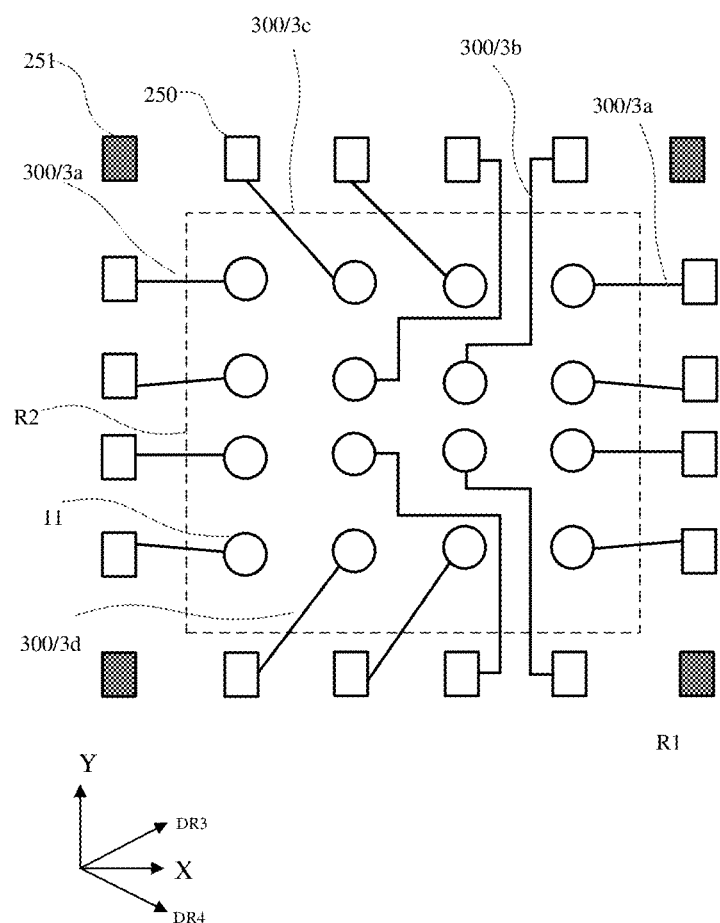

According to the display panel provided by one or more embodiments of the present disclosure, as illustrated in FIG. 5A, FIG. 6 and FIG. 12, the plurality of electrode leads 300 include at least one electrode lead of first type 3a extends in a first direction Y and at least one electrode lead of second type 3b extend in a second direction X, and the first direction Y intersects with the second direction X.

According to the display panel provided by one or more embodiments of the present disclosure, as illustrated in FIG. 12, the plurality of electrode leads include at least one electrode lead of first type 3a extends in a first direction Y, at least one electrode lead of second type 3b extends in a second direction Y.

Figure 11:
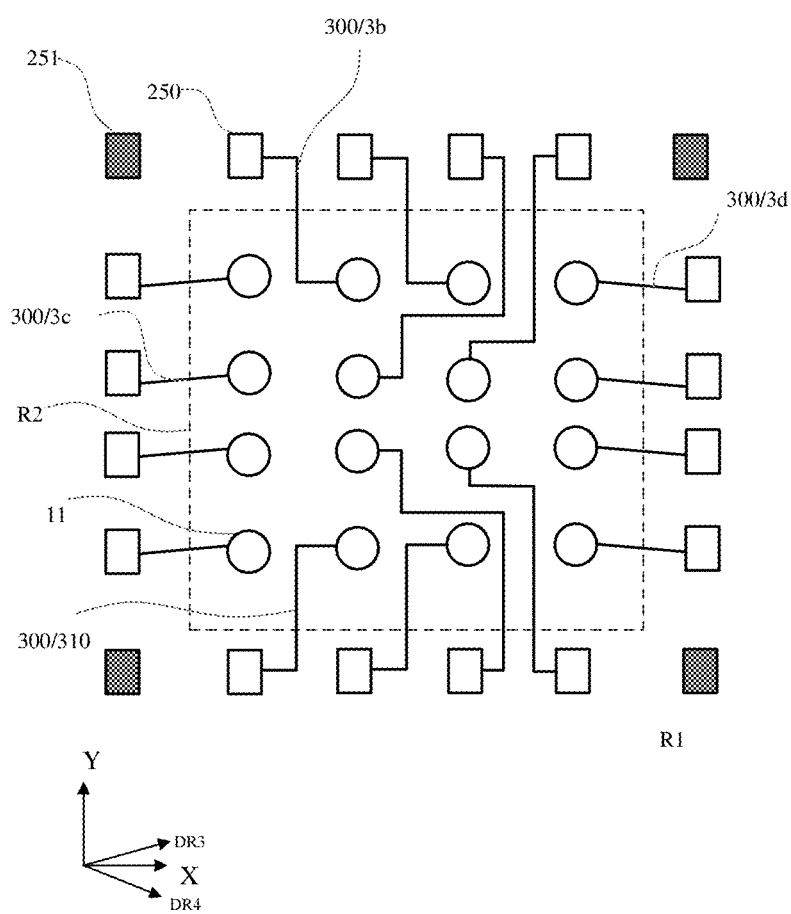

According to the display panel provided by one or more embodiments of the present disclosure, as illustrated in FIGS. 11-12, at least one electrode lead of third type 3c extend in a third direction DR3, the first direction Y intersects with the second direction X, the third direction DR3 is inclined with respect to the first direction Y and is inclined with respect to the second direction X, and the first direction Y, the second direction X, and the third direction DR3 are directions parallel with a surface of a substrate on which the plurality of electrode leads are provided. In the display panel provided by one or more embodiments of the present disclosure, by providing the electrode lead of third type that is arranged in an inclined way, the diffraction of light caused by the electrode lead can be alleviated so as to improve display effect. For example, the electrode lead of third type 3c is inclined with respect to the electrode lead of first type 3a, the electrode lead of third type 3c is inclined with respect to the second type 3b.

As illustrated in FIGS. 11-12, the plurality of electrode leads further include at least one electrode lead of fourth type 3d extend in a fourth direction DR4. For example, the fourth direction DR4 is also a direction parallel with a surface of a substrate on which the plurality of electrode leads are provided. For example, the fourth direction DR4 intersects with the third direction DR3. As illustrated in FIGS. 11-12, the second direction X is located between the third direction DR3 and the fourth direction DR4. By providing both the electrode lead of third type and the electrode lead of fourth type that are arranged in an inclined way, the diffraction of light caused by the electrode lead can be alleviated so as to improve display effect. For example, the electrode lead of fourth type 3d is inclined with respect to the electrode lead of first type 3a, the electrode lead of fourth type 3d is inclined with respect to the second type 3b.

According to the display panel provided by one or more embodiments of the present disclosure, as illustrated in FIGS. 11-12, the plurality of light emitting points are arranged in an array in a first direction Y and a second direction X, the first direction Y intersects with the second direction X, and at least one of the plurality of electrode leads 300 is inclined with respect to the first direction Y and is inclined with respect to the second direction X.

According to the display panel provided by one or more embodiments of the present disclosure, the electrode lead is made of a transparent conductive material or a metal. For example, a material of the electrode lead 300 may be a metal, a metal oxide or other conductive materials. For example, the material of the electrode lead 300 may be a transparent material so as to transmit light such as transparent metal oxide, or a transparent metal with a thinner thickness such as Ag, or a transparent graphene. For example, the transparent metal oxide includes indium tin oxide (ITO).

According to the display panel provided by one or more embodiments of the present disclosure, as illustrated in FIG. 5A, FIG. 6, FIGS. 8-12 and FIGS. 15-18, in a plan view of the display panel, a first end of the electrode lead 300 overlaps with the pixel driving circuit 250 connected to the electrode lead 300, and a second end of the electrode lead 300 overlaps with the light emitting point 11 connected to the electrode lead 300. For example, light emitting point 11 is connected to the pixel driving circuit 250 through the electrode lead 300, the light emitting point 11 is not in contact with the pixel driving circuit 250. For example, as illustrated in FIG. 5A, FIG. 6 and FIGS. 8-12, a first end of the electrode lead 300 is in contact with the pixel driving circuit 250, and a second end of the electrode lead 300 is in contact with the light emitting point 11.

According to the display panel provided by one or more embodiments of the present disclosure, as illustrated in FIG. 16, in order to increase driving current of the light emitting point 11 located in the second region, at least two of the plurality of pixel driving circuits is connected to one of the plurality of light emitting points 11. As illustrated in FIG. 16, the at least two of the plurality of pixel driving circuits 250 connected to one of the plurality of light emitting points 11 are adjacent to each other, which is not limited thereto. For example, the number of the pixel driving circuits 250 connected to one of the plurality of light emitting points 11 can be arranged as required.

Figure 17:
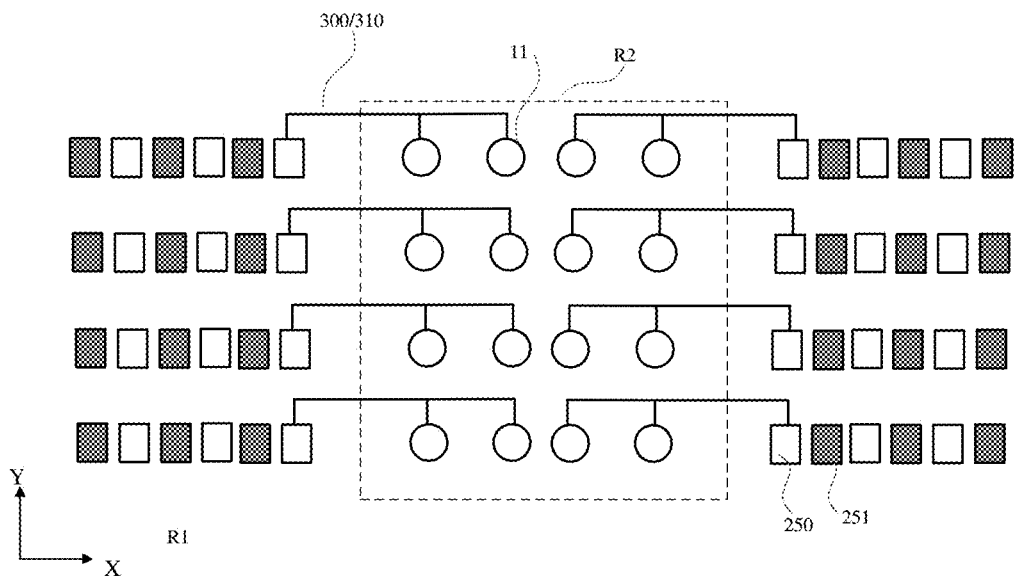

According to the display panel provided by one or more embodiments of the present disclosure, as illustrated in FIG. 17, in order to provide less electrode lead 300 so as to improve transmittance of the display panel, one of the plurality of pixel driving circuits is connected to at least two of the plurality of light emitting points. In other embodiments of the present disclosure, one pixel driving circuit can be connected to more than two light emitting points.

Figure 18:
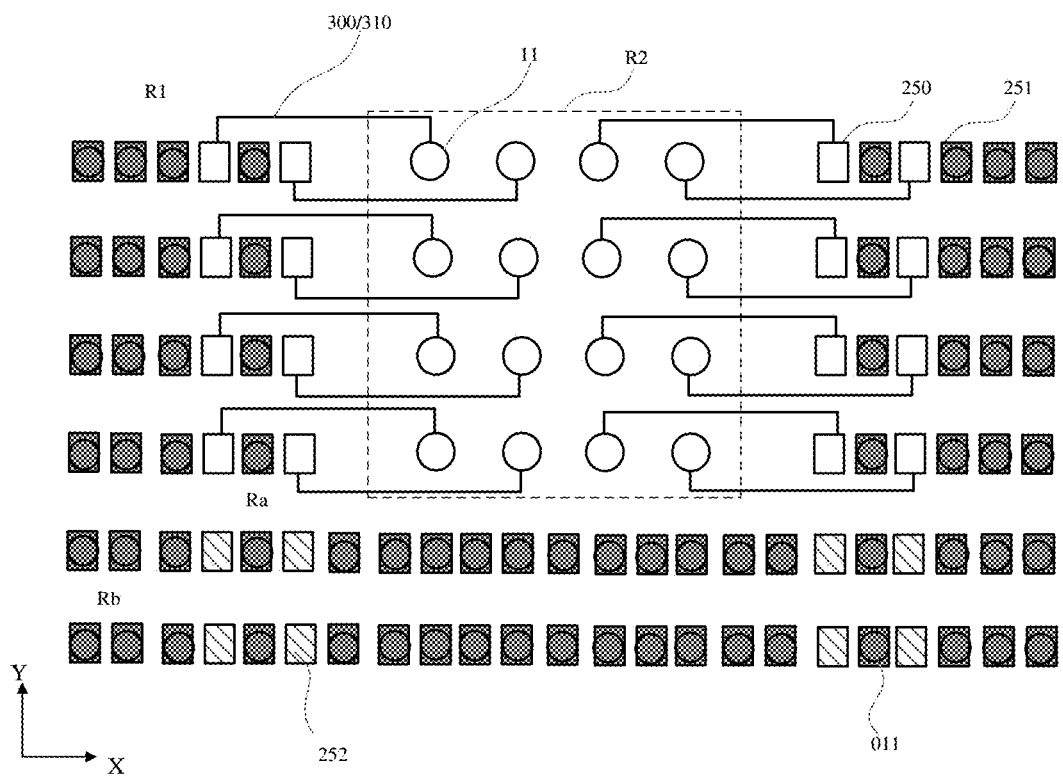

According to the display panel provided by one or more embodiments of the present disclosure, as illustrated in FIG. 18, the first region R1 includes a transition region Ra located close to the second region R2, and the plurality of pixel driving circuits 250 are located in the transition region Ra. As illustrated in FIG. 18, the first region R1 further includes a region Rb other than the transition region Ra. As illustrated in FIG. 18, the transition region Ra is closer to the second region R2 than the region Rb.

According to the display panel provided by one or more embodiments of the present disclosure, as illustrated in FIGS. 8-12 and 15-18, the display panel further includes a plurality of in situ light emitting points 011, the plurality of in situ light emitting points 011 are located in the first region R1. For example, one of the plurality of in situ light emitting points 011 is connected to one of the plurality of in situ pixel driving circuits 251. As illustrated in FIG. 18, an orthographic projection of the in situ pixel driving circuit 251 on a substrate at least partially overlap with an orthographic projection of the in situ light emitting points 011 connected to the in situ pixel driving circuit 251.

For example, as illustrated in FIG. 5A, FIG. 6, FIGS. 8-12 and FIGS. 15-18, the light emitting point 11 may include two electrodes and a light emitting layer arranged between the two electrodes. One of the two electrodes of the light emitting point 11 is connected to the electrode lead 300.

For example, as illustrated in FIG. 18, in some embodiments of the present disclosure, a plurality of dummy pixel driving circuits 252 are provided. For example, the dummy pixel driving circuit 252 is not connected to any light emitting point 11 and is not connected to any in situ light emitting point 011.

For example, as illustrated in FIG. 18, in some embodiments of the present disclosure, in order to increase display effect, a density of the in situ light emitting point 011 is larger than or equal to that of the light emitting point 11.

For example, in some embodiments of the present disclosure, in order to increase display effect, a resolution of the display panel in the first region R1 where the in situ light emitting point 011 is located is larger than or equal to that of the display panel in the second region R2 where the light emitting point 11 is located. For example, in some embodiments of the present disclosure, a resolution of the display panel at various positions is the same.

For example, as illustrated in FIGS. 13-14, the electrode leads 300 can be arranged in at least one layer. In the case where more the light emitting points 11 are provided, more electrode leads 300 are needed. In order to realize the connection between the electrode lead 300 and the light emitting point 11, the electrode leads 300 can be arranged in a plurality of layers. FIG. 13 illustrates that the electrode leads 300 includes electrode leads 301, electrode leads 302, and electrode leads 303. For example, the electrode leads 301 are located in a first patterned layer, the electrode leads 302 are located in a second patterned layer, and the electrode leads 303 are located in a third patterned layer. FIG. 14 also illustrates the in situ pixel driving circuit 251, the in situ light emitting point 011, and the light emitting point 11, as illustrated in FIG. 14, a buffer layer BL is located on a substrate BS, the in situ pixel driving circuit 251 is located on the buffer layer BL. As illustrated in FIG. 14, the in situ pixel driving circuit 251 includes a thin film transistor, the thin film transistor includes a gate electrode GE, an active layer ACT, a source electrode SE, and a drain electrode DE. FIG. 14 illustrates a first insulating layer IL1, a second insulating layer IL2, a third insulating layer IL3, a fourth insulating layer IL4, a fifth insulating layer IL5, and a sixth insulating layer IL6. As illustrated in FIG. 14, each of the in situ light emitting point 011 and the light emitting point 11 includes an electrode E1, an electrode E2, and a light emitting layer EML located therebetween. As illustrated in FIG. 14, the fourth insulating layer IL4 is located between the first patterned layer in which the electrode lead 301 is located and the second patterned layer in which the electrode lead 302 is located, the fifth insulating layer IL5 is located between the second patterned layer in which the electrode lead 302 is located and the third patterned layer in which the electrode lead 303 is located. FIG. 14 illustrates an encapsulation layer CS for encapsulating the in situ light emitting point 011 and the light emitting point 11. For example, the electrode E2 is a common electrode. FIG. 14 illustrates a pixel defining layer PDL configured to define a light-emitting region of the light emitting point 11 or the in situ light emitting point 011. For example, the buffer layer BL, the first insulating layer ILL the second insulating layer IL2, the third insulating layer IL3, the fourth insulating layer IL4, the fifth insulating layer IL5, the sixth insulating layer IL6, and the pixel defining layer PDL are made of an insulating material.

For example, as illustrated in FIG. 13, in order to improve light transmittance, electrode leads in different layers can be overlapped with each other. For example, as illustrated in FIG. 13, at least two of the electrode lead 301, electrode lead 302, and electrode lead 303 are overlapped with each other.

As illustrated in FIG. 19A, the electrode leads 300, a gate line GL, a data line DL are illustrated, FIG. 19A also illustrates the in situ pixel driving circuit 251, the pixel driving circuit 250, the in situ light emitting point 011 and the light emitting point 11. FIG. 19A also illustrates dummy pixel DPX, the dummy pixel DPX does not emit light. For example, the dummy pixel DPX is not provided with the electrode E1.

As illustrated in FIGS. 19A-19B, in some display panels provided by the embodiments of the present disclosure, some data lines and some gate lines are arranged in the region Rc. For example, in some embodiments, neither pixel driving circuit and nor light emitting point are provided in the region Rc.

For example, in some other embodiments of the present disclosure, light emitting point can be further provided in a region where the transparent region 114 (illustrated in FIGS. 2, 5a, and 6-7) is located. For example, in this case, the display panel can be a near-eye display panel or a light filed display panel, but is not limited thereto. For example, the K active display areas can be K view points, but is not limited thereto.

For example, as illustrated in FIG. 8-13, 15-19B, a region between adjacent light emitting points 11 is a light-transmitting region. The second region R2 is a light-transmitting and display region.

Figure 21:
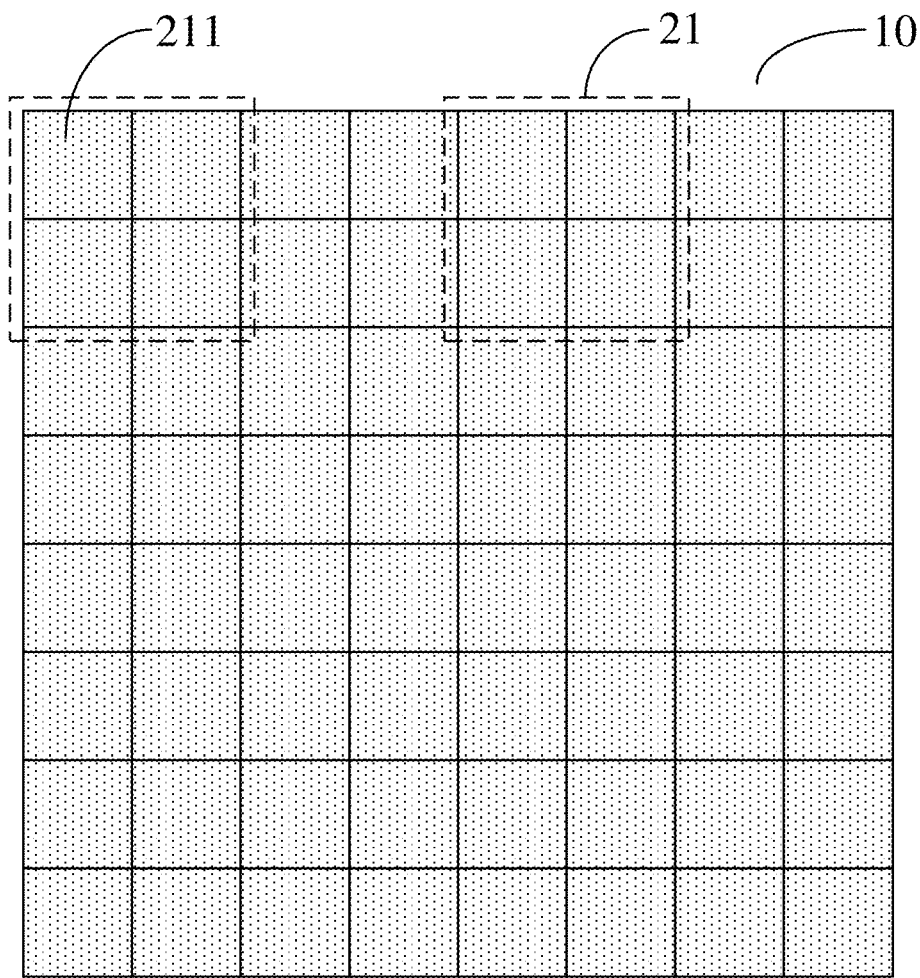
FIG. 21 is a schematic structural diagram of a display substrate according to an embodiment of the present application.
Figure 22:
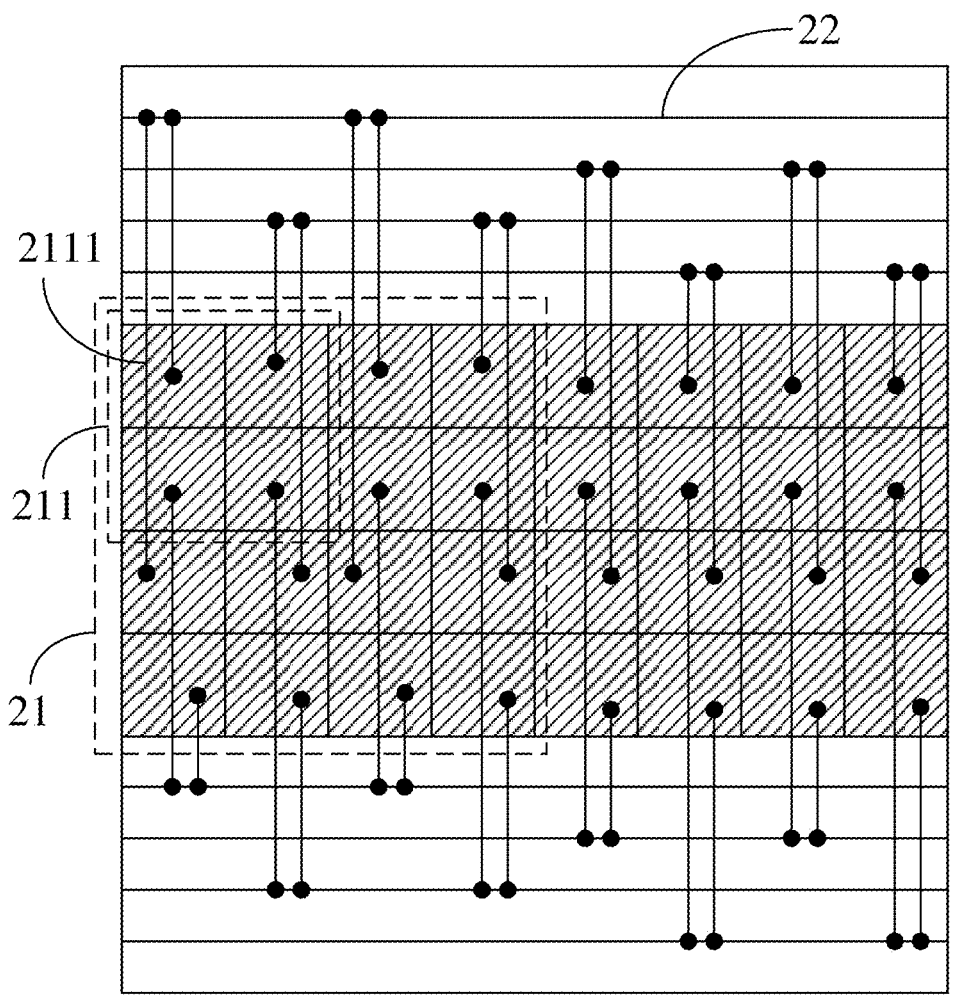
FIG. 22 is a schematic structural diagram of a specific wiring of first light emitting units in a light emitting block according to an embodiment of the present application.
Figure 23:
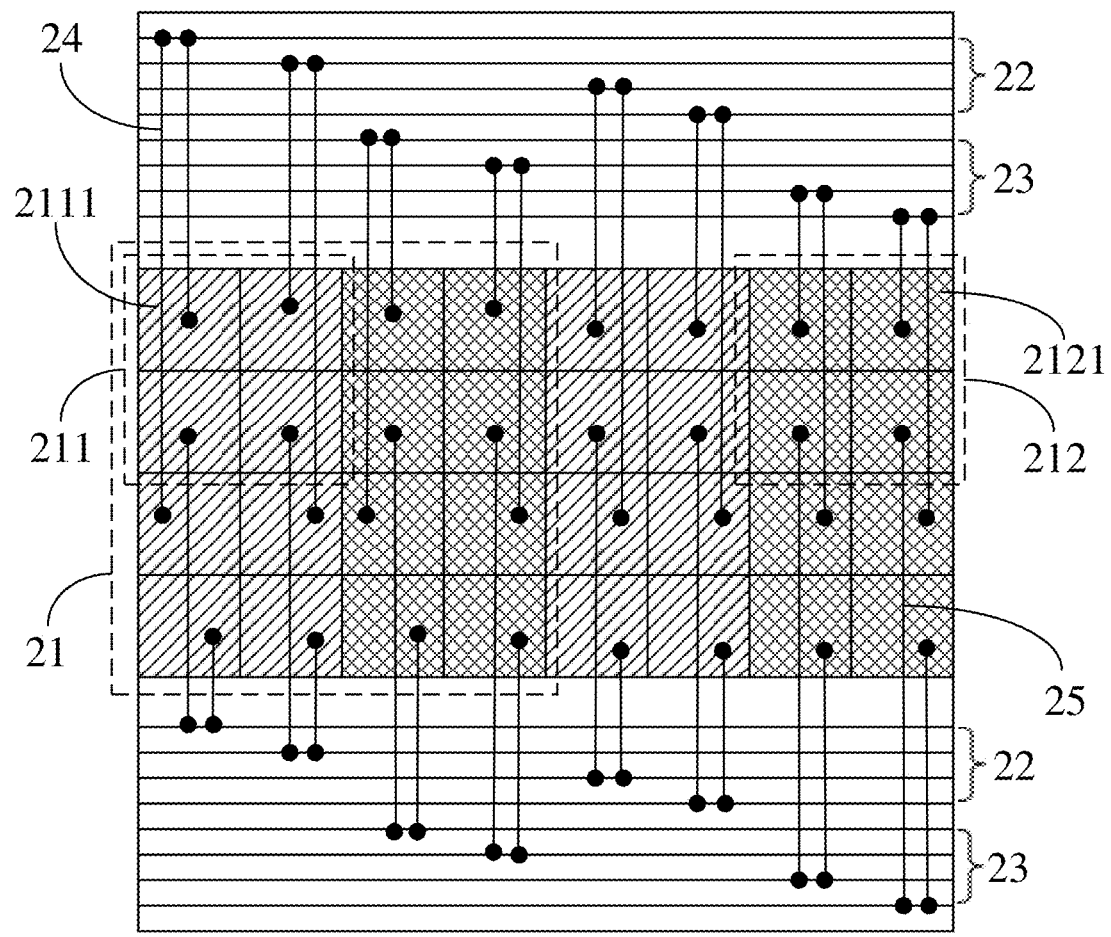
FIG. 23 is a schematic structural diagram of a specific wiring of first light emitting units and second light emitting units in a light emitting block according to an embodiment of the present application.
Figure 24:
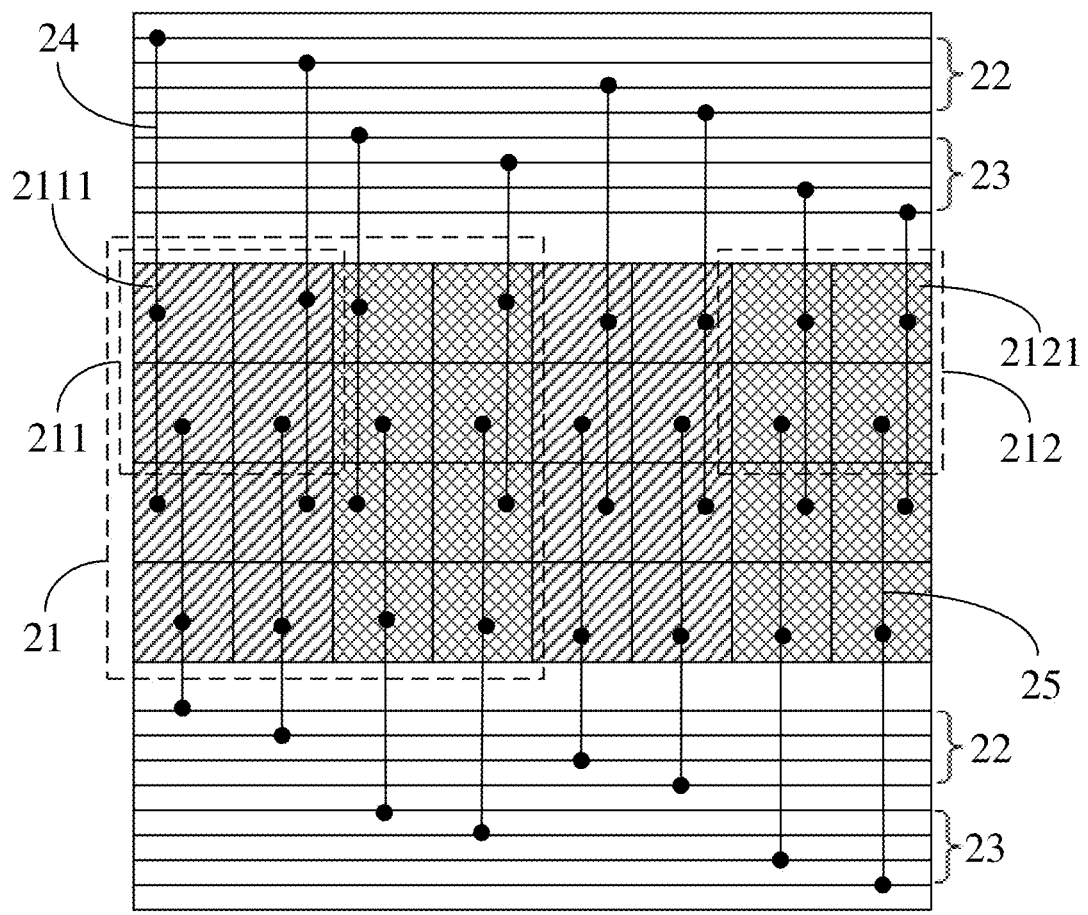
FIG. 24 is a schematic structural diagram of another specific wiring of first light emitting units and second light emitting units in a light emitting block according to an embodiment of the present application.
Figure 25:
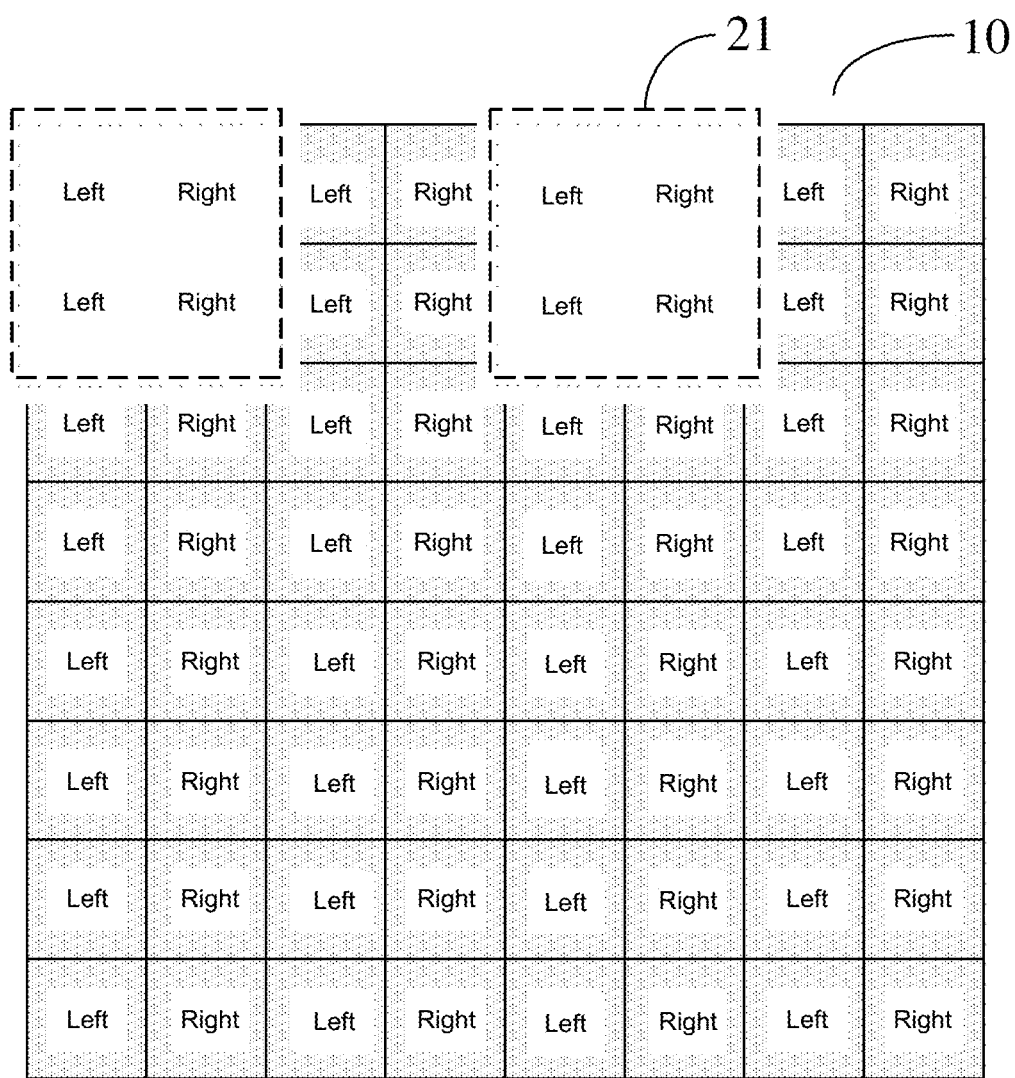
FIG. 25 is a schematic structural diagram of another display substrate according to an embodiment of the present application.
Figure 26:
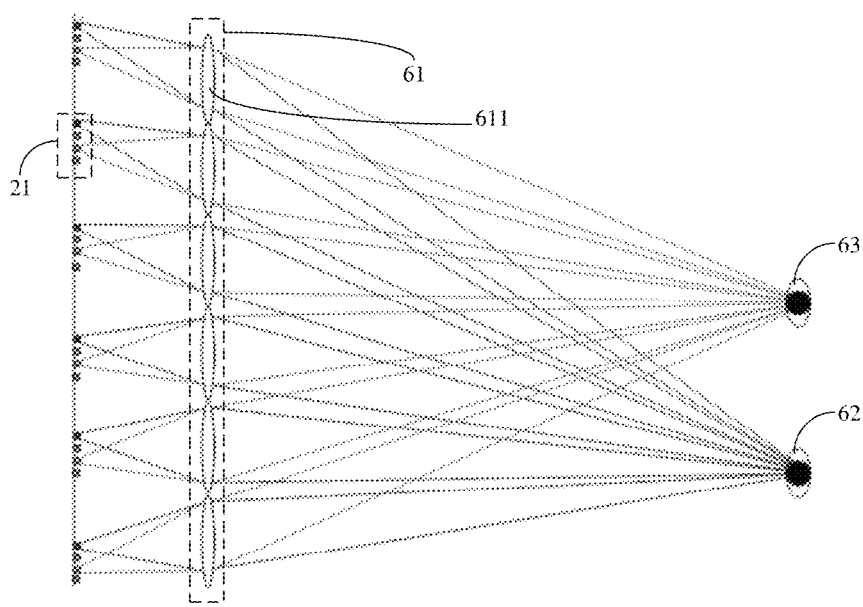
FIG. 26 is a schematic structural diagram of a light field display apparatus according to an embodiment of the present application.

FIG. 21 is a schematic structural diagram of a display substrate according to an embodiment of the present application; FIG. 22 is a schematic structural diagram of a specific wiring of first light emitting units in a light emitting block according to an embodiment of the present application; FIG. 23 is a schematic structural diagram of a specific wiring of first light emitting units and second light emitting units in a light emitting block according to an embodiment of the present application; FIG. 24 is a schematic structural diagram of another specific wiring of first light emitting units and second light emitting units in a light emitting block according to an embodiment of the present application. FIG. 25 is a schematic structural diagram of another display substrate according to an embodiment of the present application;

FIG. 26 is a schematic structural diagram of a light field display apparatus according to an embodiment of the present application.

As shown in FIG. 21 and FIG. 22, FIG. 21 is a schematic structural diagram of a display substrate according to an embodiment of the present application, and FIG. 22 is a schematic structural diagram of a specific wiring of light emitting units included in a light emitting block. The display substrate comprises a base substrate 10, at least one light emitting block 21 on the base substrate 10, and a plurality of first driving leads 22.

Each of the light emitting blocks 21 comprises a plurality of first light emitting units 211 (for example, four first light emitting units 211 as shown), and each of the first light emitting units 211 comprises a plurality of first light emitting points 2111 (for example, four first light emitting points 2111 as shown) located at a plurality of predetermined positions in the first light emitting unit 211 respectively.

In FIG. 21 and FIG. 22, as an example, the light emitting blocks 21 are arranged in a matrix form, the plurality of first light emitting units 211 in each of the light emitting blocks 21 are arranged in a matrix form, the plurality of first light emitting points 2111 in each of the first light emitting units 211 are arranged in a matrix form. In this case, the predetermined positions may be determined by rows and columns in the matrix.

Each of the first driving leads 22 is electrically connected to first light emitting points 2111 at the same predetermined positions in the respective first light emitting units 211 and is configured to receive a first driving signal from a driving circuit.

Specifically, in the embodiment of the present application, first light emitting points located at the same positions in different light emitting blocks are connected to different first driving leads. In a specific implementation, a light emitting unit composed of first light emitting points connected to the same first driving lead 22 corresponds to one sub-pixel unit on the display substrate, and colors of light emitted from the first light emitting points may comprise red, green, and blue, or, of course, other colors such as yellow.

The display substrate according to the embodiment of the present application comprises: a base substrate; a light emitting block on the base substrate, wherein the light emitting block comprises a plurality of first light emitting units, and each of the first light emitting units comprises a plurality of first light emitting points located at a plurality of predetermined positions in the first light emitting unit respectively; and first driving leads electrically connected to first light emitting points located at the same predetermined positions in the respective first light emitting units and configured to receive a first driving signal from a driving circuit. Therefore, in the embodiment of the present application, any of the first driving leads may drive a plurality of first light emitting points to emit light at the same time. Compared with the related art, in the embodiment of the present application, a number of light emitting points is significantly improved, and a number of light beams in the space which may be provided is significantly improved, so that a better light field display effect may be achieved.

Specifically, as shown in FIG. 22, two light emitting blocks 21 are shown in FIG. 22, each of the light emitting blocks 21 comprises four first light emitting units 211, and each of the first light emitting units 211 comprises four first light emitting points 2111. In a first one of the light emitting blocks 21, a first light emitting point 2111 located at an upper left corner of each of the first light emitting units 211 is connected to a $1^{st}$ first driving lead 22 from top to bottom; a first light emitting point 2111 located at an upper right corner of each of the first light emitting units 211 is connected to a $3^{rd}$ first driving lead 22 from top to bottom; a first light emitting point 2111 located at a lower left corner of each of the first light emitting units 211 is connected to a $5^{th}$ first driving lead 22 from top to bottom; and a first light emitting point 2111 located at a lower right corner of each of the first light emitting units 211 is connected to a $7^{th}$ first driving lead 22 from top to bottom.

As shown in FIG. 22, in a second one of the light emitting blocks 21, a first light emitting point 2111 located at an upper left corner of each of the first light emitting units 211 is connected to a $2^{nd}$ first driving lead 22; a first light emitting point 2111 located at an upper right corner of each of the first light emitting units 211 is connected to a $4^{th}$ first driving lead 22; a first light emitting point 2111 located at a lower left corner of each of the first light emitting units 211 is connected to a $6^{th}$ first driving lead 22; and a first light emitting point 2111 at a lower right corner of each of the first light emitting units 211 is connected to an $8^{th}$ first driving lead 22.

Specifically, in the embodiment of the present application, the display substrate is a self-luminous type top emission display substrate. In a specific implementation, the display substrate may be a top emission OLED display substrate, or may be a Quantum dot Light Emitting Diode (Q-LED) display substrate, or may also be a top emission LED display substrate. A driving circuit of the self-luminous type top emission display substrate is disposed on a side of the light emitting points away from a light emitting side, so that the arrangement of the driving leads may not affect a light emitting efficiency of the display substrate, and a resolution of the display substrate may be improved.

Further, in the embodiment of the present application, in order to realize 3D display by the display substrate, as shown in FIG. 23, each of the light emitting blocks 21 further comprises a plurality of second light emitting units 212, and each of the second light emitting units 212 comprises a plurality of second light emitting points 2121 located at a plurality of predetermined positions in the light emitting unit 212 respectively.

Similarly, as an example, the plurality of second light emitting units 212 in each of the light emitting blocks 21 are arranged in a matrix form and the plurality of second light emitting points 2121 in each of the second light emitting units 212 are arranged in a matrix form.

Specifically, for 3D display, the first light emitting units 211 are left-eye light emitting units, and the second light emitting units 212 are right-eye light emitting units; and the first light emitting points 2111 are left-eye light emitting points, and the second light emitting points 2121 are right-eye light emitting points.

In some embodiments, as shown in FIG. 23, the display substrate according to the embodiment of the present application further comprises a plurality of second driving leads 23, wherein each of the second driving leads 23 is electrically connected to second light emitting points 2121 located at the same predetermined positions in the respective second light emitting units 212, and is configured to receive a second drive signal from the driving circuit.

Specifically, as shown in FIG. 23, two light emitting blocks 21 are shown in FIG. 23, and each of the light emitting blocks 21 comprises two first light emitting units 211 and two second light emitting units 212, each of the first light emitting units 211 comprises four first light emitting points 2111, and each of the second light emitting units 212 comprises four second light emitting points 2121.

As shown in FIG. 23, in a first one of the light emitting blocks 21, a first light emitting point 2111 located at an upper left corner of each of the first light emitting units 211 is connected to a $1^{st}$ first driving lead 22 from top to bottom; a first light emitting point 2111 located at an upper right corner of each of the first light emitting units 211 is connected to a 2nd first driving lead 22 from top to bottom; a first light emitting point 2111 located at a lower left corner of each of the first light emitting units 211 is connected to a $5^{th}$ first driving lead 22 from top to bottom; and a first light emitting point 2111 located at a lower right corner of each of the first light emitting units 211 is connected to a $6^{th}$ first driving lead 22 from top to bottom; and in a second one of the light emitting blocks 21, a light emitting point 2111 located at an upper left corner of each of the first light emitting units 211 is connected to a $3^{rd}$ first driving lead 22 from top to bottom; a first light emitting point 2111 located at an upper right corner of each of the first light emitting units 211 is connected to a $4^{th}$ first driving lead 22 from top to bottom; a first light emitting point 2111 located at a lower left corner of each of the first light emitting units 211 is connected to a $7^{th}$ first driving lead 22 from top to bottom; and a first light emitting point 2111 located at a lower right corner of each of the first light emitting units 211 is connected to an $8^{th}$ first driving lead 22 from top to bottom.

As shown in FIG. 23, in the first light emitting block 21, a second light emitting point 2121 located at the upper left corner of each of the second light emitting units 212 is connected to a $1^{st}$ second driving lead 23 from top to bottom; a second light emitting point 2121 located at the upper right corner of each of the second light emitting units 212 is connected to a $2^{nd}$ second driving lead 23 from top to bottom; a second light emitting point 2121 located at the lower left corner of each of the second light emitting units 212 is connected to a $5^{th}$ second driving lead 23 from top to bottom; and a second light emitting point 2121 located at the lower right corner of each of the second light emitting units 212 is connected to a $6^{th}$ second driving lead 23 from top to bottom; and in the second light emitting block 21, a second light emitting point 2121 located at the upper left corner of each of the second light emitting units 212 is connected to a $3^{rd}$ second driving lead 23 from top to bottom; a second light emitting point 2121 located at the upper right corner of each of the second light emitting units 212 is connected to a $4^{th}$ second driving lead 23 from top to bottom; a second light emitting point 2121 located at the lower left corner of each of the second light emitting units 212 is connected to a $7^{th}$ second driving lead 23 from top to bottom; and a second light emitting point 2121 located at the lower right corner of each of the second light emitting units 212 is connected to an $8^{th}$ second driving lead 23 from top to bottom.

In a specific implementation, in the embodiment of the present application, a number of the first light emitting units 211 is equal to that of the second light emitting units 212, and a specific number of the first light emitting points 2111 included in each of the first light emitting units 211 and a specific number of the second light emitting points 2121 included in each of the second light emitting units 2121 are set according to practical production process conditions, and in a case where the process allows, the first light emitting points 2111 and the second light emitting points 2121 are set as many as possible.

In some embodiments, as shown in FIG. 23, the display substrate according to the embodiment of the present application further comprises a plurality of first branch leads 24 and a plurality of second branch leads 25, wherein each of the first light emitting points 2111 is connected to a corresponding one of the first driving leads 22 through a corresponding one of the first branch leads 24, that is, each of the first branch leads 24 is connected to a corresponding one of the first light emitting points 2111; and each of the second light emitting points 2121 is connected to a corresponding one of the second driving leads 23 through a corresponding one of the second branch leads 25, that is, each of the second branch leads 25 is connected to a corresponding one of the second light emitting points 2121.

In some other embodiments, as shown in FIG. 24, the display substrate according to the embodiment of the present application further comprises a plurality of first branch leads 24 and a plurality of second branch leads 25, wherein each of the first branch leads 24 is connected to all the first light emitting points 2111 which are connected to the same first driving lead 22 in an extending direction of the first branch lead 24, and each of the second branch leads 25 is connected to all the second light emitting points 2121 which are connected to the same second driving lead 23 in an extending direction of the second branch lead 25. With this arrangement, the same column of first light emitting units are enabled to correspond to the same picture during display and the same column of second light emitting units are enabled to correspond to the same picture during display using a small number of branch leads. In this way, when a person raises or lowers his/her head without movement, a viewing angle at which an object or a picture is viewed does not change, which may correspond to a case where a viewing angle at which an object or a picture is viewed does not change.

In a specific implementation, in the embodiment of the present application, the first driving leads and the second driving leads extend in a horizontal direction, and the first branch leads and the second branch leads extend in a vertical direction. Of course, in practical design, the first driving leads, the second driving leads, the first branch leads, and the second branch leads may also not be configured as straight lines but may be configured as curved lines or broken lines.

In some embodiments, as shown in FIGS. 23 and 24, the first driving leads 22 and the second driving leads 23 are arranged in a first direction (in the vertical direction as shown), the first branch leads 24 and the second branch leads 25 are arranged in a second direction (in the horizontal direction as shown), and in each of the light emitting blocks 21, when a number of the first light emitting points 2111 included in each of the first light emitting unit 211 is m times n, and a number of the second light emitting points 2121 included in each of the second light emitting units 212 is m times n, a number of first driving leads 22 corresponding to the light emitting block is m times n, and a number of second driving leads 23 corresponding to the light emitting block is m times n, where m and n are both positive numbers greater than 1. In FIGS. 23 and 24, an example in which m is equal to 2 and n is equal to 2 is illustrated for description. In this case, the number of the first driving leads 22 and the number of the second driving leads corresponding to each of the light emitting blocks are both illustrated as four. In FIGS. 23 and 24, there are illustrated two light emitting blocks, and thus there are illustrated eight first driving leads 22 and eight second driving leads 23.

In some embodiments, as shown in FIG. 25, in a set direction, left-eye light emitting units and right-eye light emitting units are alternately arranged, wherein the set direction refers to a direction which is set for the entire display substrate, and is specifically the horizontal direction. That is, in the entire display substrate, the left-eye light emitting units and the right-eye light emitting units are alternately arranged in the horizontal direction. The left-eye light emitting units are used for displaying an image for a left eye, and the right-eye light emitting units are used for displaying an image for a right eye.

In some embodiments, as shown in FIG. 25, in the embodiment of the present application, when the number of the light emitting blocks 21 is more than two, the light emitting blocks 21 are arranged in a matrix form. In some embodiments, the light emitting blocks 21 are arranged all over the entire display substrate in a matrix form.

Specifically, in the embodiment of the present application, the first driving leads and the second driving leads are connected to an output terminal of a driving circuit, which specifically comprises a plurality of thin film transistors, capacitors, and signal lines (such as scanning signal lines, data signal lines, power signal lines, etc.) Since the improvement of the present application does not involve the thin film transistors, the capacitors, and the signal lines in the driving circuit, they will not be described in detail here.

In some embodiments, the embodiments of the present disclosure further provide a method for manufacturing a display substrate, specifically comprising: manufacturing, on a base substrate, a plurality of first light emitting units, a plurality of second light emitting units, a plurality of first driving leads, a plurality of second driving leads, a plurality of first branch leads, and a plurality of second branch leads. Specifically, the first driving leads and the second driving leads extend in the horizontal direction, the first branch leads and the second branch leads extend in the vertical direction, each of the first light emitting units comprises a plurality of first light emitting points, and each of the second light emitting units comprises a plurality of second light emitting points.

In a specific implementation, in the embodiment of the present application, the first light emitting units and the second light emitting units may be firstly manufactured, or the first driving leads, the second driving leads, the first branch leads, and the second branch leads may be firstly manufactured. A specific method for manufacturing the light emitting units and the second light emitting units is similar to those in the related art, and will not be described in detail here. For example, the first light emitting points in the first light emitting units and the second light emitting points in the second light emitting units may be manufactured in a current manner of manufacturing quantum dot light emitting points.

In a specific implementation, the first driving leads, the second driving leads, the first branch leads, and the second branch leads may be manufactured using a patterning process. In the embodiment of the present application, the patterning process comprises some or all of coating, exposure, development, etching, and removal of photoresist.

Based on the same concept, the embodiments of the present disclosure further provide a light field display apparatus. As shown in FIG. 26, the display apparatus comprises: the display substrate according to the embodiments of the present application; and a light angle adjustment structure 61 located on a light emitting side of the display substrate and configured to deflect light emitted from first light emitting points electrically connected to the same first driving lead to different directions.

In some embodiments, the light angle adjustment structure 61 is further configured to deflect light emitted from second light emitting points 2121 electrically connected to the same second driving lead 23 to different directions.

Specifically, as shown in FIG. 26, in the embodiment of the present application, the light angle adjustment structure 61 comprises a plurality of micro-lenses 611, wherein a position of one light emitting block 21 corresponds to a position of one micro-lens 611. Of course, in practical design, a position of one light emitting block 21 may also correspond to positions of a plurality of micro-lenses 611.

Specifically, in the embodiment of the present application, one light emitting block 21 comprises a plurality of first light emitting units and a plurality of second light emitting units, and the micro-lenses 611 may enable light emitted by the first light emitting units to enter a left eye 62 of a person, and may enable light emitted by the second light emitting units to enter a right eye 63 of the person. In the embodiment of the present application, light emitted from first light emitting points connected to the same first driving lead is deflected to different directions and light emitted from second light emitting points connected to the same second driving lead is deflected to different directions by the micro-lenses 611 disposed in correspondence to the light emitting block 21. In this way, human eyes may only view an image corresponding to one first light emitting unit and an image corresponding to one second light emitting unit in the same viewing angle in the same light emitting block 21.

Figure 27:
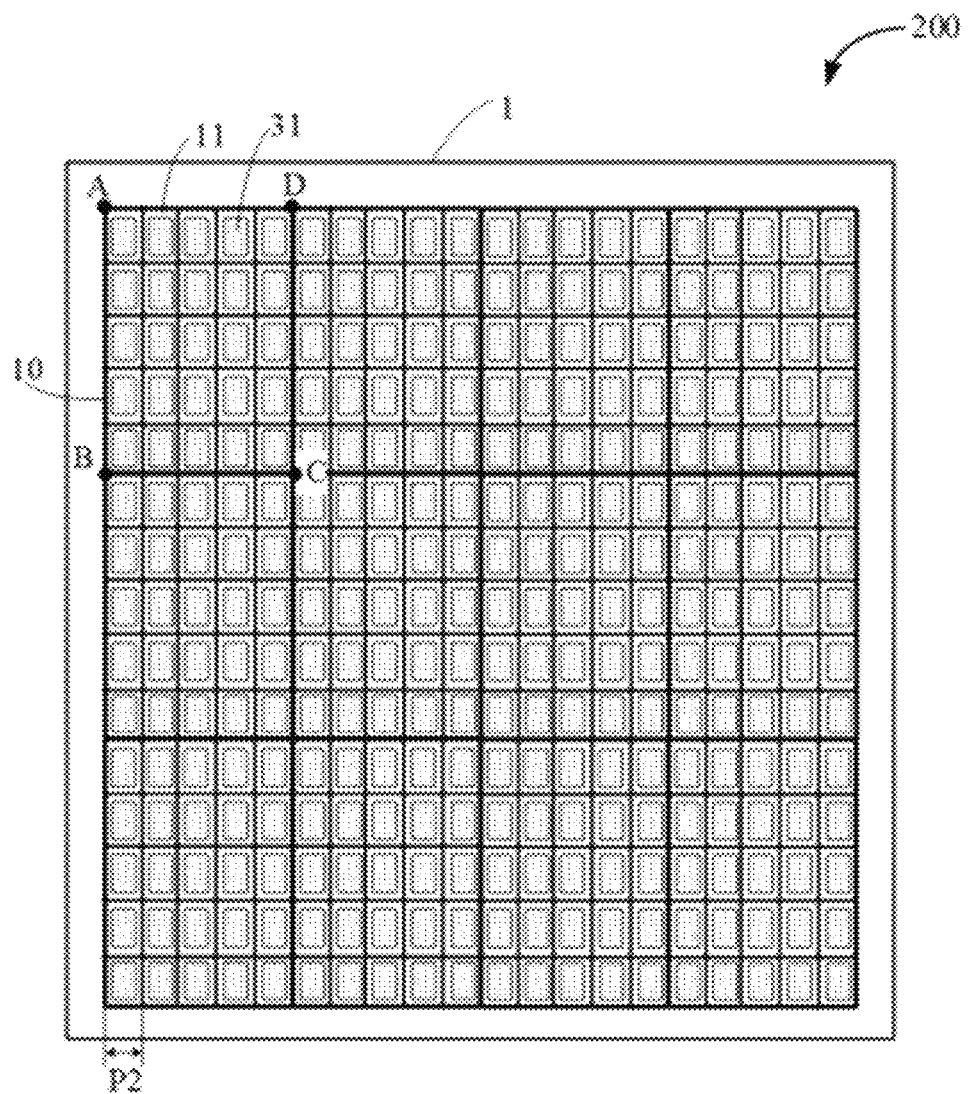
FIG. 27 shows a schematic diagram of an electrode distribution on a substrate according to an embodiment of the present disclosure.
Figure 28A:
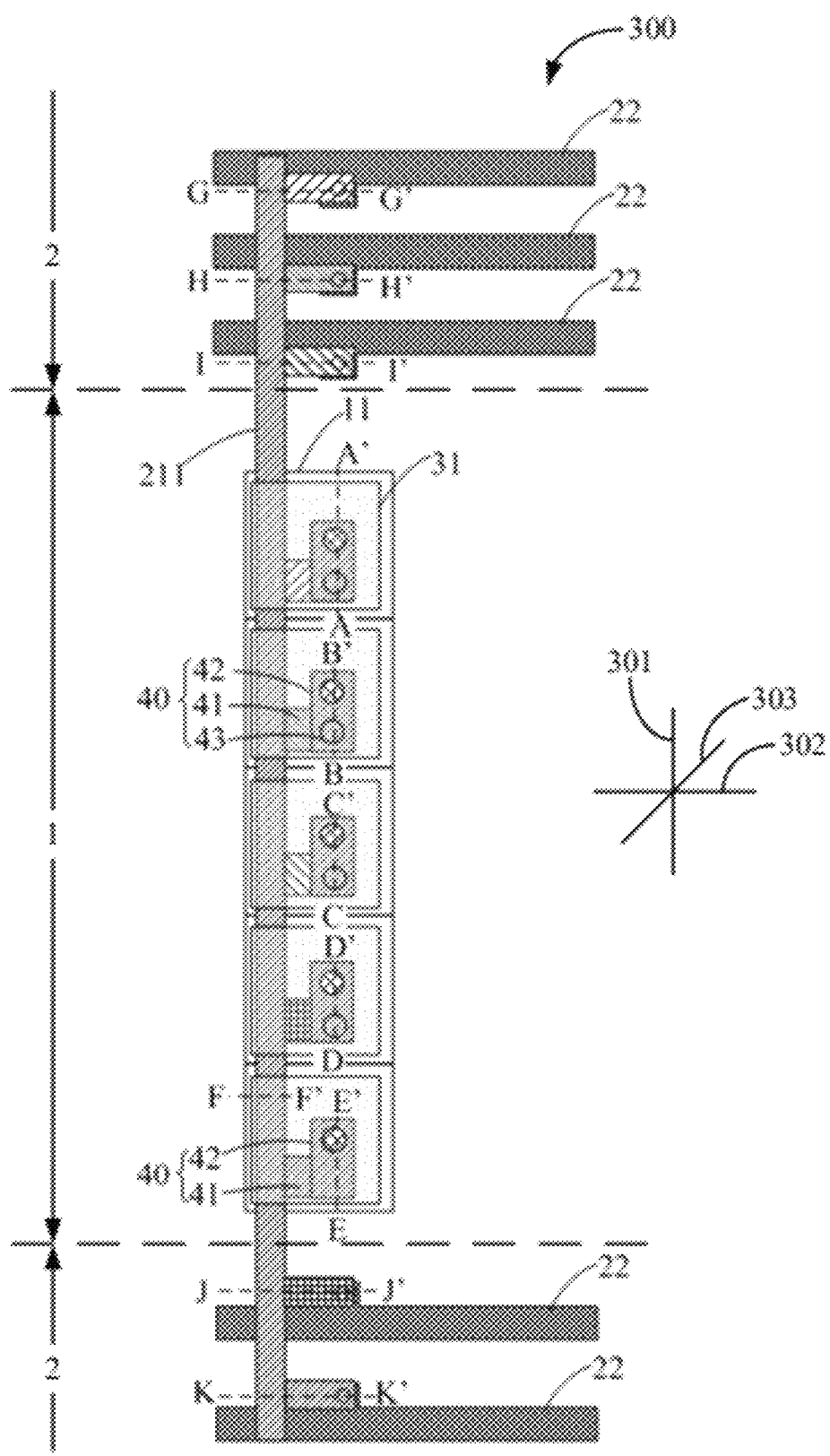
FIG. 28A shows a schematic diagram of connections between five light-emitting points, a first signal line, and a second signal line on the substrate of FIG. 27.
Figure 28B:
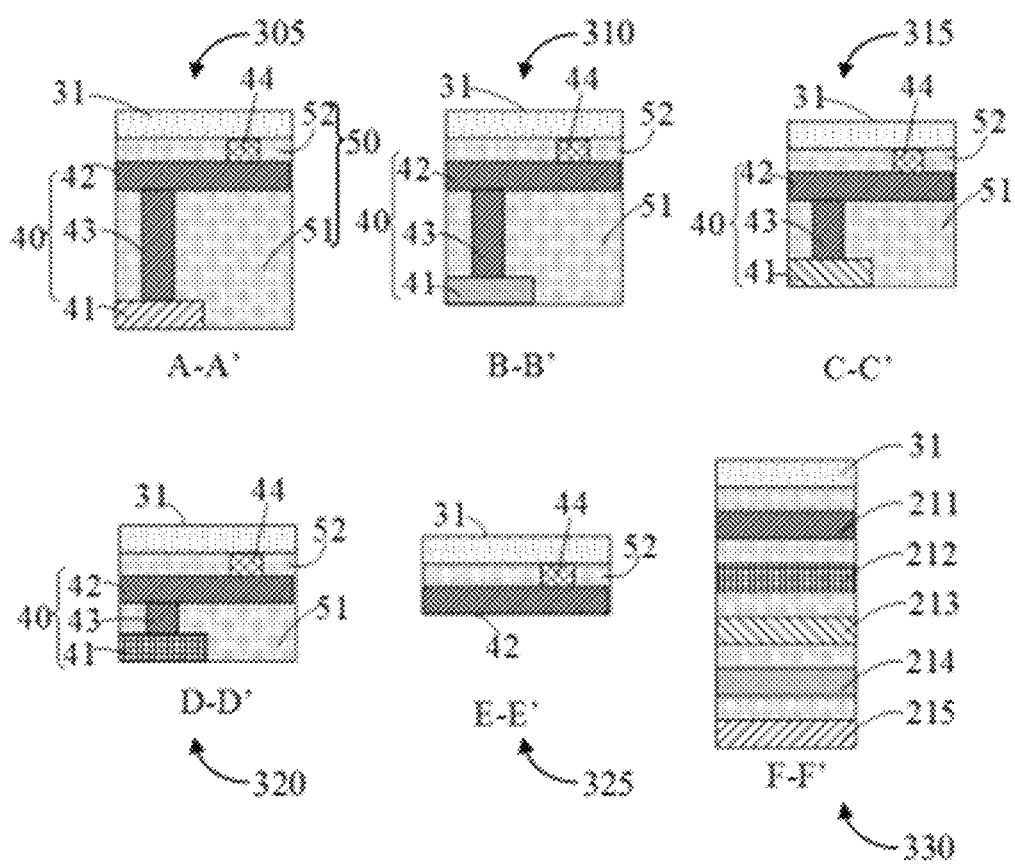
FIG. 28B shows cross-sectional views along lines A-A, B-B', C-C', D-D', E-E', and F-F' of FIG. 28A.
Figure 28C:
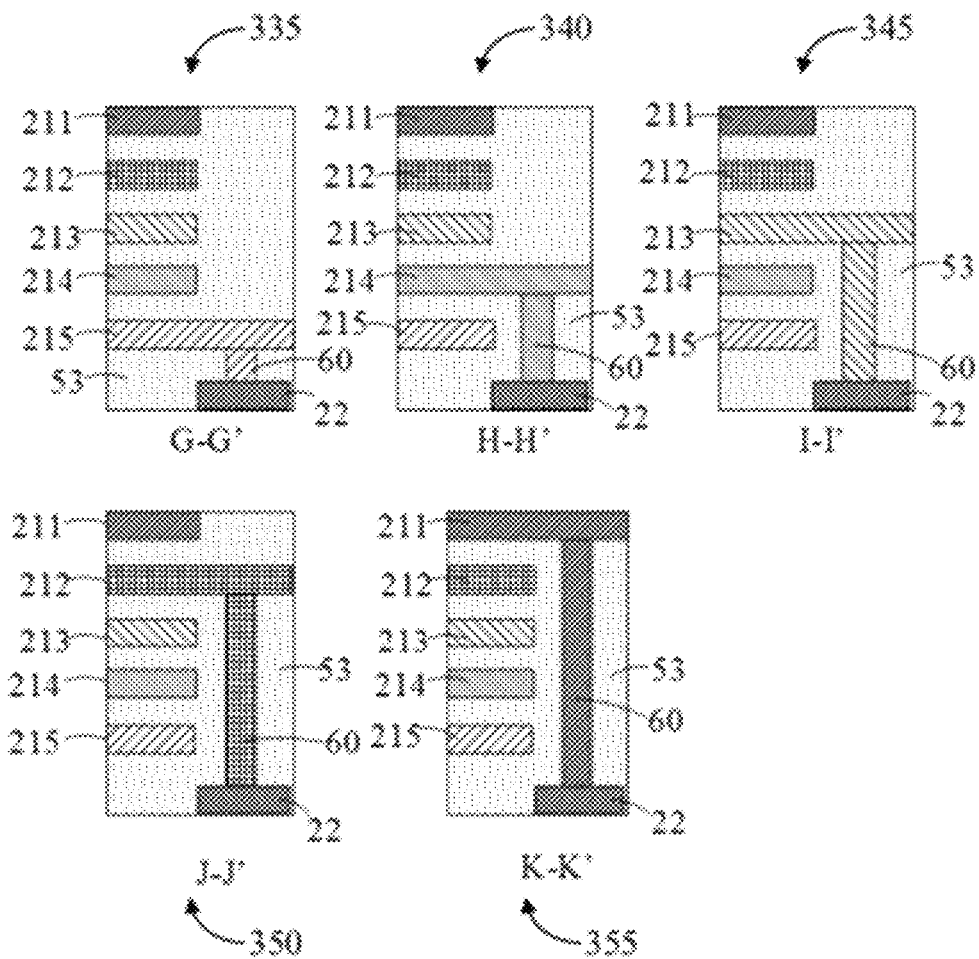
FIG. 28C shows cross-sectional views along lines G-G', H-H', I-I', J-J', and K-K' of FIG. 28A.
Figure 29:
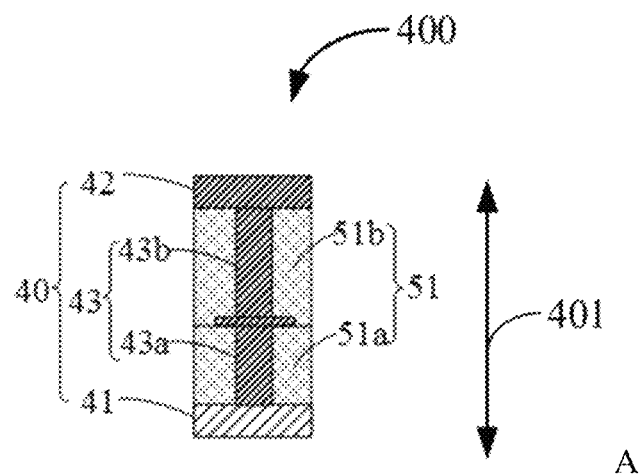
FIG. 29 shows a schematic view of a third connecting portion being formed in a divided manner.
Figure 30:
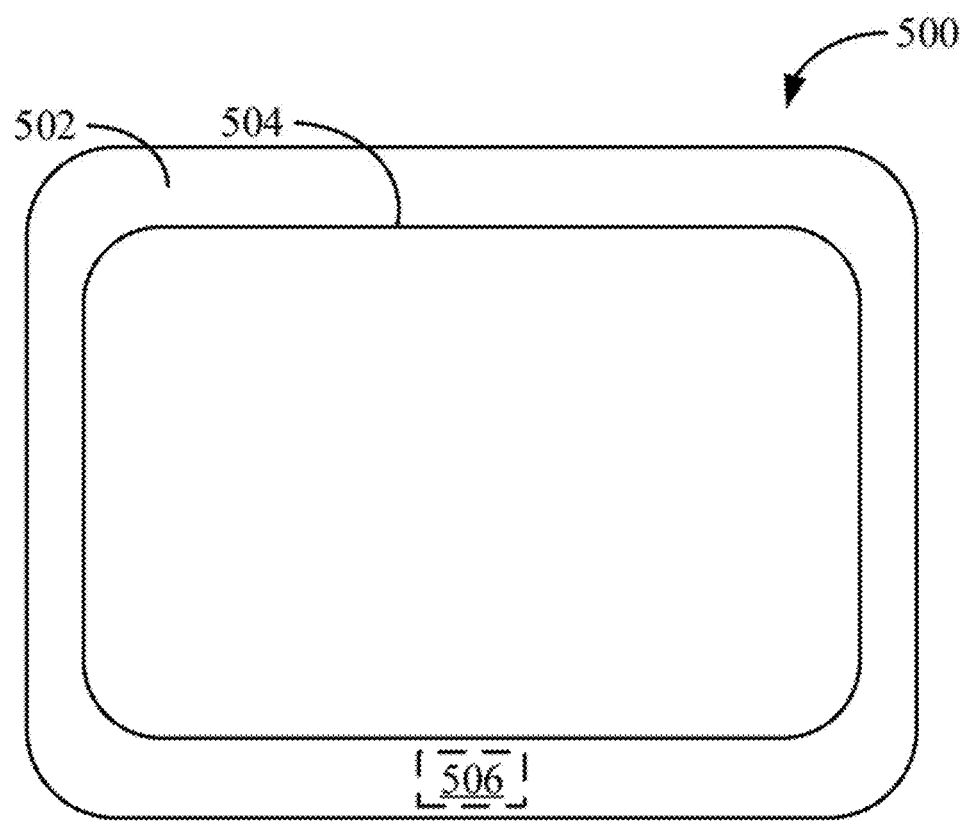
FIG. 30 shows a schematic diagram of a light field display device according to an embodiment of the present disclosure.
Figure 31:
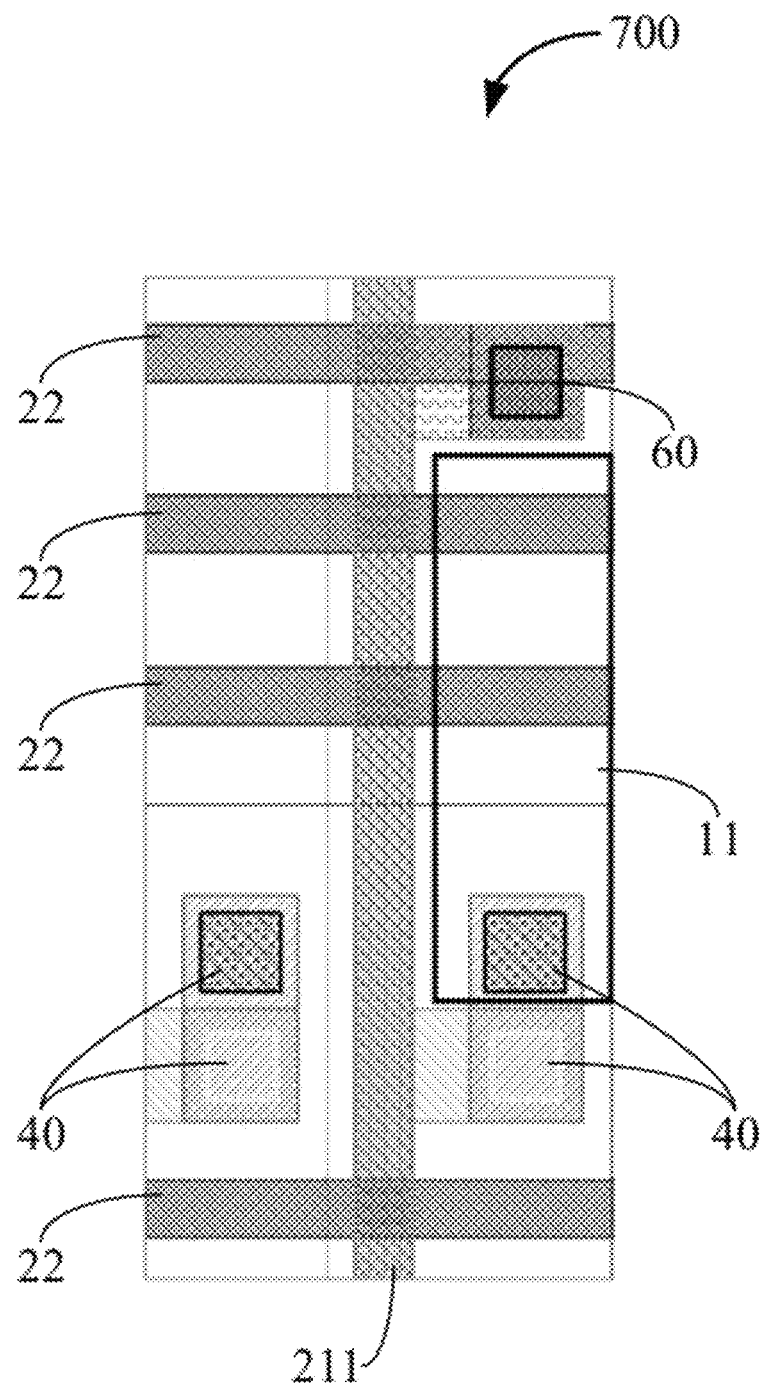
FIG. 31 shows a schematic diagram of connections between a light-emitting point, a first signal line, and a second signal line on the substrate of FIG. 27.
Figure 32C:
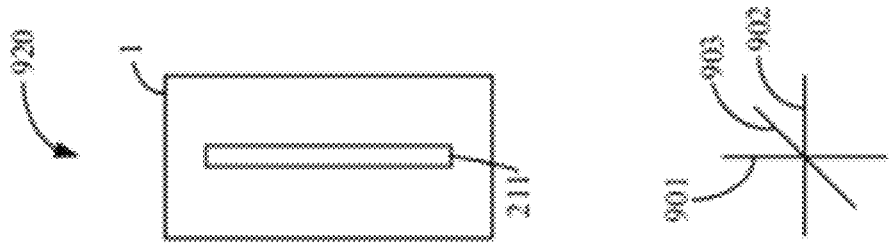
FIG. 32C shows a top view of a second example of the five first signal lines and the substrate from FIG. 32A.
Figure 32B:
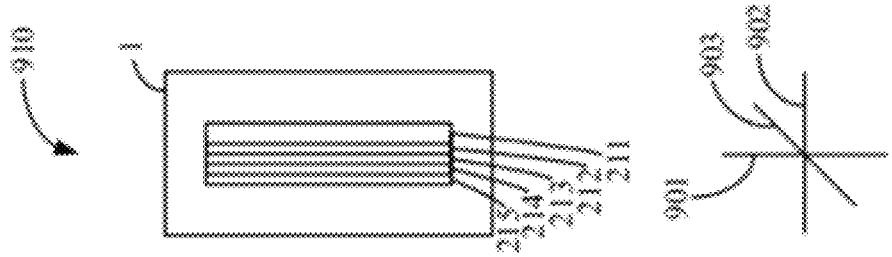
FIG. 32B shows a top view of a first example of the five first signal lines and the substrate from FIG. 32A.
Figure 32A:
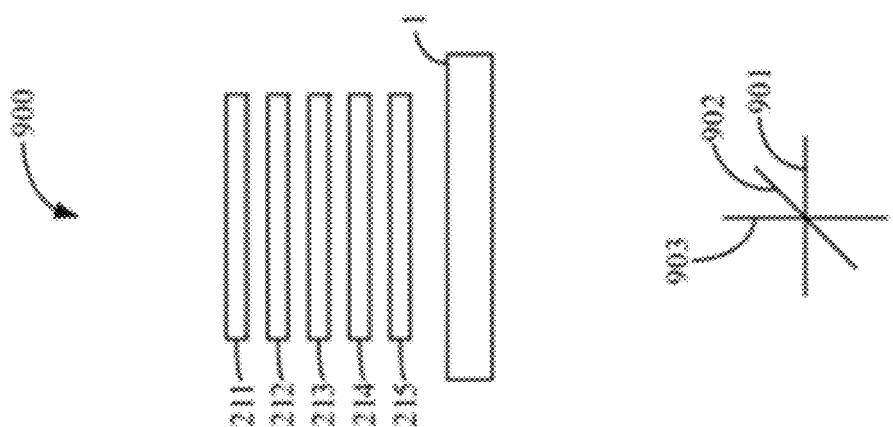
FIG. 32A shows a side view of five first signal lines and a substrate according to an embodiment of the present disclosure.

FIG. 27 shows a schematic diagram of an electrode distribution on a substrate according to an embodiment of the present disclosure. FIG. 28A shows a schematic diagram of connections between five light-emitting points, a first signal line, and a second signal line on the substrate of FIG. 27. FIG. 28B shows cross-sectional views along lines A-A', B-B', C-C', D-D', E-E', and F-F' of FIG. 28A. FIG. 28C shows cross-sectional views along lines G-G', H-H', I-I', J-J', and K-K' of FIG. 28A. FIG. 29 shows a schematic view of a third connecting portion being formed in a divided manner. FIG. 30 shows a schematic diagram of a light field display device according to an embodiment of the present disclosure. FIG. 31 shows a schematic diagram of connections between a light-emitting point, a first signal line, and a second signal line on the substrate of FIG. 27. FIG. 32A shows a side view of five first signal lines and a substrate according to an embodiment of the present disclosure. FIG. 32B shows a top view of a first example of the five first signal lines and the substrate from FIG. 32A. FIG. 32C shows a top view of a second example of the five first signal lines and the substrate from FIG. 32A.

FIG. 27 depicts a schematic diagram 200 of an electrode distribution on a substrate 1 according to an embodiment of the present disclosure, and FIG. 28A depicts a schematic diagram 300 of connections between five light-emitting points 11 and a first signal line 211 and a second signal line 22 on the substrate 1. FIG. 30 depicts a further schematic diagram 700 showing the connections between light-emitting points 11 and the first signal line 211 and second signal lines 22. FIG. 28B depicts a plurality of cross-sectional views 305, 310, 315, 320, 327, 330 along lines A-A', B-B', C-C', D-D', E-E', F-F', respectively, of FIG. 28A, and FIG. 28C depicts a plurality of cross-sectional views 335, 340, 345, 350, 355 along lines G-G', H-H', I-I', J-J', K-K', respectively, of FIG. 28A. The substrate 1 may be incorporated into an array substrate, such as an array substrate for a light field display device (as described below with reference to FIG. 30). With reference to FIGS. 27-28C, the array substrate may be divided into a plurality of light-emitting units 10, each of which includes a plurality of light-emitting points 11, and each of the light-emitting points 11 may be provided with a self light-emitting device (for example, an organic light-emitting diode, or OLED). A plurality of electrodes 31 and a plurality of first signal lines 211, 212, 213, 214, 215 are disposed on the substrate 1, where the electrodes 31 may be anodes of the light-emitting devices, and cathodes of all of the light-emitting devices may be an integrated structure. As such, each of the plurality of the light-emitting points 11 may be configured to be driven by one of the plurality of electrodes 31. Each of the electrodes 31 is connected to one first signal line. The plurality of first signal lines 211 to 215 extend in a like direction, such as along axis 301 or axis 302 of FIG. 28A. Of the plurality of first signal lines 211 to 215, at least two of the first signal lines are located in different layers of an insulating spacer 50, and at least two of the first signal lines in the different layers overlap at least partially on the substrate 1. An example in which five first signal lines 211 to 215 are overlapped is depicted in cross-sectional view 330 of FIG. 28B.

It should be understood that embodiments of the present disclosure may adopt one or more specific configurations of the conventional light field display device. For example, light-emitting unit 10 may adopt substantially similar aspects or configurations of light-emitting unit 110, light-emitting point 11 may adopt substantially similar aspects or configurations of light-emitting point 111, etc. It should further be understood that embodiments of the present disclosure may add additional elements, aspects, or other configurations not present in the conventional light field display device.

FIG. 28A depicts the substrate 1 and a non-display region 2 of the array substrate. The substrate 1 may include the light-emitting units 10, the light-emitting points 11, the electrodes 31, the insulating spacer 50, and the first signal lines (e.g., 211 to 215), as well as connections between the electrodes 31 and the first signal lines, and connecting elements therewith (e.g., 40, 41, 42, 43; as described below with reference to FIGS. 28A-28B and 29). The non-display region 2 may include the second signal lines 22, as well as connections between the first signal lines (e.g., 211 to 215) and the second signal lines 22, and connecting elements therewith (e.g., 60; as described below with reference to FIG. 28C).

The plurality of first signal lines 211 to 215 may not all be located in one layer. Rather, at least two of the first signal lines are disposed in different layers and orthographic projections on the substrate 1 of the at least two first signal lines overlap, that is, the at least two first signal lines are arranged in a stack, and an overall width of the stacked first signal lines is smaller than an overall width of the first signal lines when they are all located in one layer, thereby facilitating reducing a light-emitting point size and thereby increasing a density of the light-emitting points, so as to achieve improved light field display effects.

In one example, "orthographic projection" includes a projection of three spatial dimensions into two spatial dimensions. For example, schematic diagram 300 in FIG. 28A is an orthographic projection of a three-dimensional space defined by axes 301, 302, and 303 to a two-dimensional space defined by axes 301 and 302 (where the axes 301 and 302 are in the plane of FIG. 28A, and the axis 303 is orthogonal to the plane of FIG. 28A). Further, "overlap" may refer to one element partially or completely obscuring another in an orthographic projection. For example, the first signal line 211 overlaps the first signal lines 212 to 215 completely in FIG. 28A. As another example, the first signal line 211 partially overlaps the second signal lines 22 shown in FIG. 28A.

As a further example, FIGS. 32A-32C depict views of the five first signal lines 211 to 215 and the substrate 1. In the examples shown by FIGS. 32A-32C, it will be understood that each of the five first signal lines 211 to 215 are of equivalent dimensions to one another. In other examples in the present disclosure, each of the five first signal lines may have substantially similar, but not necessarily equivalent, dimensions to one another. In other examples in the present disclosure, each of the five first signal lines may have substantially different dimensions to one another. FIG. 32A depicts a side view 900 of the five first signal lines 211 to 215 and the substrate 1. A plane of the side view 900 may be defined by axes 901 and 903. Axis 902 is orthogonal to the plane of the side view 900. FIG. 32B depicts a top view 910 showing a first example of the five signal lines 211 to 215 and the substrate 1 depicted in FIG. 32A. A plane of the top view 910 may be defined by the axes 901 and 902. Axis 903 is orthogonal to the plane of the top view 910. In the first example of FIG. 32B, an orthographic projection on the substrate 1 of the first signal line 211 partially overlaps an orthographic projection on the substrate 1 of the first signal line 212. Further, an orthographic projection on the substrate 1 of the first signal line 212 partially overlaps an orthographic projection on the substrate 1 of the first signal line 213, and so on. FIG. 32C depicts a top view 920 showing a second example of the five signal lines 211 to 215 and the substrate 1 depicted in FIG. 32A. A plane of the top view 920 may be defined by the axes 901 and 902. Axis 903 is orthogonal to the plane of the top view 920. In the second example of FIG. 32C, an orthographic projection on the substrate 1 of the first signal line 211 completely overlaps orthographic projections on the substrate 1 of the first signal lines 212 to 215. As such, the first signal lines 212 to 215 are not visible in the top view 920.

Returning to the discussion of FIGS. 27-28C and 31, the array substrate may be divided into a plurality of light-emitting units 10 arranged in a matrix, such as in FIG. 27. Further, the light-emitting points 11 in each light-emitting unit 10 are arranged in a matrix, or array, that is, the electrodes 31 are arranged in a matrix. The plurality of electrodes 31 are divided into a plurality of groups, where each group includes a further plurality of electrodes 31, and the further plurality of electrodes 31 in a given group are sequentially arranged along the extending direction of the first signal lines 211 to 215. The first signal lines 211 to 215 may be extended in a vertical direction (that is, a column direction of the matrix of electrodes 31), as shown in FIGS. 28A and 28B. The electrodes 31 in a given column may be considered as one group. Of course, in a specific implementation, the first signal lines 211 to 215 may also be extended in a horizontal direction (that is, a row direction of the matrix of electrodes 31). Each electrode 31 in a given group may be connected to one of a corresponding plurality, or second plurality, of first signal lines, wherein the corresponding plurality of first signal lines may be one or more of the plurality, or first plurality, of first signal lines 211 to 215, a subset of the plurality of first signal lines 211 to 215, and another plurality of first signal lines not including first signal lines 211 to 215.

It should be noted that though each of the electrodes 31 is connected to a first signal line (e.g., 211), that does not necessarily mean that the first signal lines to which different electrodes 31 are connected are different from each other. For example, among two light-emitting units 10 in one column, the electrode 31 of the light-emitting point 11 of an $m^{th}$ row and an $n^{th}$ column of one of the light-emitting units 10 may be connected to the same first signal line (e.g., 211) as the light-emitting point 11 of an $m^{th}$ row and an $n^{th}$ column of another light-emitting unit 10. Any two light-emitting points 11 in different light-emitting units 10 may be considered to have a like position if the two light emitting points 11 are each in an $m^{th}$ row and an $n^{th}$ column of each respective light-emitting unit 10. Similarly, any two electrodes 31 in different light-emitting units 10 may be considered to have a like position if the two electrodes 31 are each in an $m^{th}$ row and an $n^{th}$ column of each respective light-emitting unit 10.

In some examples, among the plurality of first signal lines 211 to 215 to which any one of the electrodes 31 is connected, any two of the first signal lines 211 to 215 are located in different layers of the insulating spacer 50, and orthographic projections on the substrate 1 of any two of the first signal lines 211 to 215 in the different layers at least partially overlap. In this way, a total width of the area occupied by a plurality of first signal lines (e.g., 211 to 215) corresponding to each group (e.g., each column) of the electrodes 31 can be reduced. For example, as shown in FIGS. 28A and 28B, the five first signal lines 211 to 215 connected to a column of the electrodes 31 are located in different layers spaced apart from each other, and orthographic projections on the substrate 1 of the five first signal lines 211 to 215 overlap (such that only first signal line 211 is visible in FIGS. 28A and 31). As another example, the three first signal lines 211 to 213 may be located in different layers spaced apart from each other, and orthographic projections on the substrate 1 of any two of the three first signal lines 211 to 213 overlap.

In some examples, each of the plurality of first signal lines 211 to 215 connected to each of the electrodes 31 are located in a different layer of the insulating spacer 50, and orthographic projections on the substrate 1 of any two of the first signal lines at least partially overlap. That is, all of the plurality of first signal lines 211 to 215 connected to the electrode 31 of the same column of the light-emitting points 11 are stacked, thereby further reducing the area occupied by the first signal lines 211 to 215.

Specifically, a plurality of first signal lines (e.g., 211 to 215) connected to a group of electrodes 31 are orthographically projected on the substrate 1 in a projection area, and a width of the projection area is equal to a maximum width of the first signal lines 211 to 215. As such, a total width of the plurality of first signal lines 211 to 215 connected to the group of electrodes 31 on the substrate 1 is a width of the first signal line having a largest width, and thereby a total width of the plurality of first signal lines 211 to 215 is minimized. When each width of the first signal lines 211 to 215 is equivalent, the first signal lines 211 to 215 to which the same group of electrodes 31 are connected are located along a single straight path. It should be understood that when the first signal lines 211 to 215 extend in the vertical direction (that is, the column direction of the matrix of electrodes 31), the width of the projection area and the width of the first signal lines 211 to 215 are each along the horizontal direction (that is, the row direction of the matrix of electrodes 31).

The plurality of electrodes 31 may be disposed in one layer, and each of the first signal lines 211 to 215 may be located between the layer where the plurality of electrodes 31 is located and the substrate 1, as shown in FIG. 28B.

As shown in FIGS. 28A and 28B, each of the electrodes 31 is connected to a corresponding first signal line (e.g., one of 211 to 215) through a first connecting member 40. The first connecting member 40 is located on one side of the first signal lines 211 to 215 in a width direction thereof. In some examples, the first connecting member 40 is made of a metal material having a relatively high electrical conductivity.

Specifically, the first connecting member 40 includes a first connecting portion 41 and a second connecting portion 42. The first connecting portion 41 and a correspondingly connected first signal line (e.g., 211) are disposed in a first layer, and the second connecting portion 42 is connected to the corresponding electrode 31.

More specifically, the second connecting portion 42 is disposed in the same layer as the first signal line 211 farthest from the substrate 1. That is, the first signal line 211 farthest from the substrate 1 and its corresponding first connecting portion 41 and second connecting portion 42 are disposed in a second layer and are directly connected. It should be understood that, on the substrate 1, there may be a plurality of first signal lines in the layer in which each of the first signal lines 211 to 215 is located, that is, the number of the first signal lines disposed in the same layer as the first connecting portion 41 may be more than one.

As shown in FIG. 28B, the insulating spacer 50 may at least include a first insulating layer 51. In some embodiments, the insulating spacer 50 may further include a second insulating layer, such as second insulating layer 53 shown in FIG. 28C. As further shown in FIG. 28B, the insulating spacer 50 may further include a third insulating layer 52. The first insulating layer 51 is disposed between the first connecting portion 41 and the second connecting portion 42, corresponding to the remaining first signal lines 212 to 215 (that is, excepting the first signal line 211 farthest from the substrate 1). The first insulating layer 51 is provided with a first via hole, and the second connecting portion 42 is connected to the corresponding first connecting portion 41 by a third connecting portion 43 filled in the first via hole.

At the time of fabrication, the conductive metal material is filled in the first via hole to form the third connecting portion 43. Thereafter, a tip end of the third connecting portion 43 is ground to be flush with the first via hole by chemical mechanical polishing. The second connecting portion 42 is then formed. As compared with a process in which the second connecting portion 42 is directly connected to the first connecting portion 41 through the first via hole, providing the third connecting portion 43 can prevent the second connecting portion 42 from being broken when the first via hole is too deep, thereby ensuring connection reliability and also making the connecting position flatter.

It should be understood that the first connecting portion 41 is in the same layer as a corresponding first signal line (e.g., 212, 213, 214, 215) and the second connecting portion 42 is in the same layer as the first signal line 211 farthest from the substrate 1. As such, when layers of the plurality of first signal lines 211 to 215 corresponding to the electrodes 31 of the same column are different from each other, the respective thicknesses of the first insulating layers 51 between the first connecting portion 41 and the second connecting portion 42 corresponding to the different first signal lines are also different. Correspondingly, the depths of the first via holes corresponding to electrodes 31 of the same column are different from each other. In this case, to ensure connection reliability between the third connecting portion 43 and each of the corresponding second connecting portion 42 and the first connecting portion 41, a given first via hole having a relatively larger depth may be formed by etching a plurality of times, and the third connecting portion 43 may be deposited in stages.

To that end, FIG. 29 depicts a schematic view 400 showing structure of an array substrate (as described below with reference to FIG. 30) when the third connecting portion 43 is formed in stages. As shown in FIG. 29, at least one first via hole includes at least two sub-via holes arranged and connected along an axial direction thereof (such as along axis 401), and each of the sub-via holes is filled with a sub-portion of the third connecting portion 43. At the time of fabrication, after forming a first partial film layer 51a of the first insulating layer 51, a first sub-via hole is formed on the first partial film layer 51a, and a first sub-portion 43a of the third connecting portion 43 is formed in the first sub-via hole. Thereafter, a second partial film layer 51b of the insulating layer 51 is formed and a second sub-via hole is formed on the second partial film layer 51b, and a second sub-portion 43b of the third connecting portion 43 is formed in the second sub-via hole. It should be understood that the number of sub-via holes (and corresponding fabrication stages) may be more than two.

Returning to FIGS. 28A-28C and 31, to connect the second connecting portion 42 and the electrode 31, a via hole may be formed on the third insulating layer 52 between the second connecting portion 42 and the electrode 31, whereby the electrode 31 may be connected to the second connecting portion 42 through the via hole. As shown in FIG. 28B, a fourth connecting portion 44 is filled in the via hole, and the electrode 31 is connected to the second connecting portion 42 by the fourth connecting portion 44.

The above is a description of an arrangement and connection manner of the first signal line (e.g., 211) and the electrode 31 on the substrate 1. In addition, in one embodiment, the substrate 1 is further provided with a driving structure (not shown) and a plurality of second signal lines 22. As shown in FIG. 28C, the driving structure supplies a driving signal to the first signal lines 211 to 215 through the plurality of second signal lines 22, thereby supplying a driving signal to the electrode 31. Here, as also shown in FIGS. 28A and 31, the first signal line 211 and an extending direction of the second signal line 22 intersect. As shown in FIGS. 28A and 28B, the first signal lines 211 to 215 are located on along a single straight path and are stacked, that is, extending directions of the first signal lines 212 to 215 and the second signal line 22 also intersect. Each of the electrodes 31 corresponds to a second signal line 22 and is connected to the corresponding second signal line 22 through a corresponding first signal line (e.g., 211, 212, 213, 214, 215). It should be noted that each of the electrodes 31 corresponds to one second signal line 22, but each of the second signal lines 22 may correspond to a plurality of the electrodes 31.

Specifically, in any two of the light-emitting units 10 (as depicted, for example, in FIG. 27) arranged along the extending direction of the first signal lines 211 to 215, the electrodes 31 of the two light-emitting points 11 having the same position are connected to the same second signal line 22 through a corresponding first signal line (e.g., 211). In some examples, in any two of the light-emitting units 10 arranged along the extending direction of the first signal lines 211 to 215, each of the electrodes 31 of the two light-emitting points having the same position are correspondingly connected to two first signal lines. In other examples, in any two of the light-emitting units 10 arranged along the extending direction of the first signal lines 211 to 215, the electrodes 31 of the two light-emitting points 11 having the same position are connected to the same first signal line (e.g., 211). Herein, "two light-emitting points 11 having the same position of the two light-emitting units 10" means that two light-emitting points 11 have the same position in two respective light-emitting units 10, for example, in the third row and the third column of one light-emitting unit 10 and in the third row and the third column of another light-emitting unit 10. For the case in which each of the light-emitting units 10 in FIG. 27 includes 5×5 light-emitting points 11, a total of 25 first signal lines (e.g., 211; not shown at FIG. 27) are connected to each column of the light-emitting units 10.

Further, as shown in FIG. 28C, the second insulating layer 53 is disposed between each of the first signal lines 211 to 215 and the corresponding second signal line 22, and a second via hole is disposed on the second insulating layer 53. The first signal lines 211 to 215 and the corresponding second signal lines 22 are connected by second connecting members 60 penetrating through the second via holes.

The plurality of second signal lines 22 are disposed in the same layer. As such, when two first signal lines (e.g., 211, 212, 213, 214, 215) are located in different layers, the thicknesses of the second insulating layers 53 between the two first signal lines and the corresponding second signal lines 22 are different. As shown in cross-sectional view 330 of FIG. 28B, the layers of the plurality of first signal lines 211 to 215 corresponding to the electrode 31 of a given column are different from each other. In this case, as shown in FIG. 28C, the thicknesses of the second insulating layers 53 corresponding to the first signal lines 211 to 215 are different from each other. Similar to fabrication of the first via hole (as described above with reference to FIG. 29), to ensure connection reliability between the second connecting member 60 and the corresponding first signal line (e.g., 211) and the second signal line 22, at least one second via hole may include at least two sub-via holes arranged and connected along an axial direction thereof (such as along axis 401, as shown in FIG. 29), where each of the sub-via holes of the second via hole is filled with a sub-portion of the second connecting member 60. The second via hole includes at least two sub-via holes fabricated in the same manner as the first via hole including at least two sub-via holes, and is not described herein again.

In one embodiment, the first signal lines on the substrate 1 are not all located in the same layer, such that at least two first signal lines are stacked, thereby facilitating reduction of the light-emitting point size. Moreover, the plurality of first signal lines corresponding to the electrode of any one of the columns may be located along a single straight path. Assuming that a width of each of the first signal lines is W, a width of the second connecting portion is W2, and a distance between the first signal line and the second connecting portion is S, then the light-emitting point size in this case is P2=W+2S+W2. Further, when W2 is equal to W1, then P2=W+2S+W1. In one example, W=2.5 µm, S=2.5 µm, and W1=5 µm, the light-emitting point size in FIG. 27 is P2=12.5 µm, and the pixel resolution is 25400/(3*12.5)=677 PPI. Compared with conventional light field display devices, the array substrate of the present disclosure significantly improves the pixel resolution.

According to an embodiment of the present disclosure, FIG. 30 depicts a schematic diagram 500 of a light field display device 502 having an array substrate, or display, 504, where the array substrate 504 comprises the substrate (e.g., 1) described hereinabove. The light field display device may further include a power supplying circuit 506. In some embodiments, the light emitting point 11 may be an OLED, a micro-LED, a mini-LED, or a quantum dot light emitting diode (QLED), but is not limited thereto.

In some embodiments, colors of light emitted from the light emitting points 11 may include red (R), green (G), and blue (B), yellow (Y), magenta (M), cyan (C), white (W), or other colors, which can be determined as required. In some embodiments, the light emitting points 11 may emit light of RGB, or RGBW, or RGBCMY.

In some embodiments, the in situ light emitting points 011 may be an OLED, a micro-LED, a mini-LED, or a quantum dot light emitting diode (QLED), but is not limited thereto.

In some embodiments, colors of light emitted from the in situ light emitting points 011 may include red (R), green (G), and blue (B), yellow (Y), magenta (M), cyan (C), white (W), or other colors, which can be determined as required. In some embodiments, the in situ light emitting points 011 may emit light of RGB, or RGBW, or RGBCMY.

According to the display panel provided by one or more embodiments of the present disclosure, referring to FIGS. 13-14 and FIGS. 28A-28B, the electrode 31 illustrated in FIGS. 28A-28B can be the electrode E1 illustrated in FIGS. 13-14, each of plurality of light emitting points 11 include an electrode E1, and the electrode of the light emitting point 11 is connected to the electrode lead 300.

For example, the light emitting points 11 can be the first light emitting point 2111 or the second light emitting point 2121 (as illustrated in FIGS. 22-24). For example, the electrode 31 can be the electrode E1. For example, the electrode lead 300 can be a lead including the first branch lead 24 and the second branch lead 25 that is connected to the first branch lead 24 (as illustrated in FIGS. 22-24). For example, the electrode lead 300 can be a lead including the first branch lead 24 and the second branch lead 25 that is connected to the first branch lead 24 (as illustrated in FIG. 28A).

At least one embodiment of the present disclosure further provides a display device including any one of the display panel as described above.

According to the display device provided by one or more embodiments of the present disclosure, as illustrated in FIG. 21, the display device further includes a photosensitive component SS, the photosensitive component SS is located at a side of the display panel DP.

According to the display panel provided by one or more embodiments of the present disclosure, as illustrated in FIGS. 13-14, the plurality of electrode leads 300 are located in at least one patterned layer or located in a plurality of patterned layers.

According to the display panel provided by one or more embodiments of the present disclosure, as illustrated in FIGS. 13-14 and FIGS. 28A-28C, at least two electrode leads (electrode 31) 300 of the plurality of electrode leads (electrode 31) 300 are located in different layers.

According to the display panel provided by one or more embodiments of the present disclosure, as illustrated in FIGS. 13-14 and FIGS. 28A-28C, orthographic projections on a substrate of the at least two electrode leads 300 in the different layers at least partially overlap.

Figure 33:
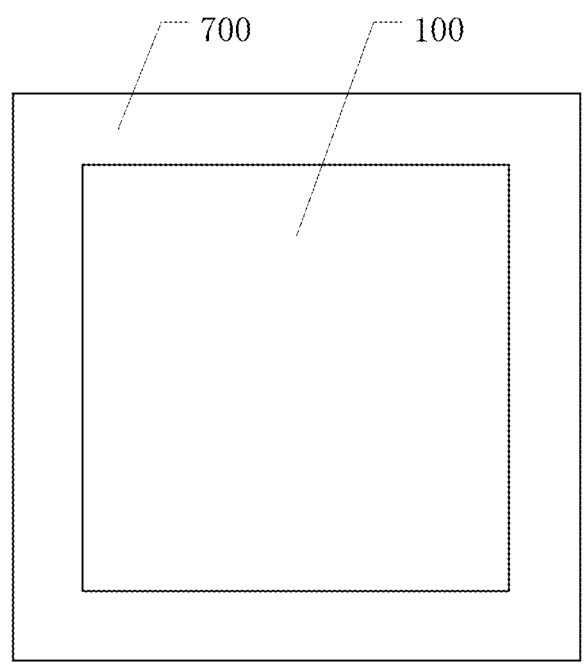
FIG. 33 is a schematic view of a display device provided by an embodiment of the present disclosure.

An embodiment of the present disclosure further provides a display device. FIG. 33 is a schematic view of a display device provided by an embodiment of the present disclosure. As illustrated in FIG. 33, the display device 700 comprises a display panel 100, the display panel 100 can be any display panel as mentioned above.

For example, as illustrated in FIG. 20, the display device includes a display panel DP and a photosensitive component SS, and the photosensitive component SS is located at a side of the display panel DP. For example, the photosensitive component SS is located under the display panel DP to realize full display. For example, photosensitive component SS includes a camera, which is not limited thereto.

For example, the display device can be a display device of full screen display, a display device of light-transmitting and full screen display, a near-eye display device, a display device of augmented reality, or a light field display device.

In the display device provided by the present embodiment, each pixel region included in the display panel can be divided into a pixel island and a transparent region, the pixel island is provided with an active display area for emitting light and displaying, and the transparent region is not provided with the active display area, and is a light-transmitting region. Therefore, the pixel island of the display panel can be used to emit light and display, and the transparent region can transmit light, so that a user can observe a real scene on a side of the display panel away from the user. The display panel can be used in a field of augmented reality. The pixel region comprises the K sub-regions with approximately equal areas, the K pixel driving circuits are respectively disposed in the K sub-regions, therefore, the pixel driving circuits of the K active display areas in the pixel island of the pixel region are uniformly distributed in the pixel region, so that signal lines connected with the pixel driving circuits are also uniformly distributed in the pixel region, thereby avoiding the formation of the signal line concentrated region having poor light transmittance, and improving the uniformity of light transmittance in the pixel region, so as to eliminate the screen window effect, improve the display effect and enhance the user experience.

For example, in some examples, the display device can be any product or component with a display function such as a smart phone, a tablet computer, a television, a display, a notebook computer, a digital photo frame, a navigator and the like.

At least one embodiment of the present disclosure provides a display panel, including: a plurality of light emitting points; a plurality of pixel driving circuits, wherein at least one of the plurality of light emitting points is connected to at least one of the plurality of pixel driving circuits; and a plurality of electrode leads, wherein the at least one of the plurality of light emitting points is connected to the at least one of the plurality of pixel driving circuits through at least one of the plurality of electrode leads; the plurality of pixel driving circuits are separated from the plurality of light emitting points.

According to the display panel provided by one or more embodiments of the present disclosure, in a plan view of the display panel, an interval is provided between one of plurality of light emitting points and the pixel driving circuit connected thereto.

According to the display panel provided by one or more embodiments of the present disclosure, the plurality of pixel driving circuits are located in a first region, the plurality of light emitting points are located in a second region, the first region is located outside the second region, the plurality of pixel driving circuits are located outside the second region where the plurality of light emitting points are located.

According to the display panel provided by one or more embodiments of the present disclosure, the electrode lead goes beyond the second region.

According to the display panel provided by one or more embodiments of the present disclosure, the electrode lead extends from the second region to the first region.

According to the display panel provided by one or more embodiments of the present disclosure, at least one of the plurality of electrode leads extends in a first direction; or at least one of the plurality of electrode leads extends in a second direction; or the plurality of electrode leads include at least one electrode lead of first type extends in a first direction and at least one electrode lead of second type extend in a second direction, and the first direction intersects with the second direction, or the plurality of electrode leads include at least one electrode lead of first type extends in a first direction, at least one electrode lead of second type extends in a second direction, and at least one electrode lead of third type extend in a third direction, the first direction intersects with the second direction, the third direction is inclined with respect to the first direction and is inclined with respect to the second direction, and the first direction, the second direction, and the third direction are directions parallel with a surface of a substrate on which the plurality of electrode leads are provided.

According to the display panel provided by one or more embodiments of the present disclosure, the plurality of light emitting points are arranged in an array in a first direction and a second direction, the first direction intersects with the second direction, and at least one of the plurality of electrode leads is inclined with respect to the first direction and is inclined with respect to the second direction.

According to the display panel provided by one or more embodiments of the present disclosure, the electrode lead is made of a transparent conductive material or a metal.

According to the display panel provided by one or more embodiments of the present disclosure, in a plan view of the display panel, a first end of the electrode lead overlaps with the pixel driving circuit connected to the electrode lead, and a second end of the electrode lead overlaps with the light emitting point connected to the electrode lead.

According to the display panel provided by one or more embodiments of the present disclosure, the plurality of electrode leads are located in at least one patterned layer or located in a plurality of patterned layers.

According to the display panel provided by one or more embodiments of the present disclosure, at least two electrode leads of the plurality of electrode leads are located in different layers.

According to the display panel provided by one or more embodiments of the present disclosure, orthographic projections on a substrate of the at least two electrode leads in the different layers at least partially overlap.

According to the display panel provided by one or more embodiments of the present disclosure, at least two of the plurality of pixel driving circuits is connected to one of the plurality of light emitting points.

According to the display panel provided by one or more embodiments of the present disclosure, one of the plurality of pixel driving circuits is connected to at least two of the plurality of light emitting points.

According to the display panel provided by one or more embodiments of the present disclosure, the first region includes a transition region located close to the second region, and the plurality of pixel driving circuits are located in the transition region.

According to the display panel provided by one or more embodiments of the present disclosure, the display panel further includes a light-shielding layer, wherein the light-shielding layer is located in the first region and not located in the second region.

According to the display panel provided by one or more embodiments of the present disclosure, the display panel further includes a plurality of in situ pixel driving circuits, wherein the plurality of pixel driving circuits are distributed at intervals between the plurality of in situ pixel driving circuits.

According to the display panel provided by one or more embodiments of the present disclosure, each of plurality of light emitting points include an electrode, and the electrode of the light emitting point is connected to the electrode lead.

At least one embodiment of the present disclosure provides a display device including any one of the display panel as described above.

According to the display device provided by one or more embodiments of the present disclosure, the display device further includes a photosensitive component, wherein the photosensitive component is located at a side of the display panel.

The following points should to be explained:

1) The drawings of at least one embodiment of the present disclosure only relate to the structure in the embodiment of the present disclosure, and other structures may be referenced to the usual design.

2) In the absence of conflict, the features of the same embodiment and the different embodiments ban be combined with each other.

The foregoing is only the embodiments of the present invention and not intended to limit the scope of protection of the present invention, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. A display panel, comprising:
   a light emitting block, wherein the light emitting block comprises a plurality of light emitting units, and each of the light emitting units comprises a plurality of light emitting points;
   a plurality of pixel driving circuits, wherein at least one of the plurality of light emitting points is connected to at least one of the plurality of pixel driving circuits; and
   a plurality of electrode leads, wherein the at least one of the plurality of light emitting points is connected to the at least one of the plurality of pixel driving circuits through at least one of the plurality of electrode leads;
   wherein the plurality of pixel driving circuits are separated from the plurality of light emitting points,
   the plurality of electrode leads comprise a plurality of driving leads and a plurality of branch leads, each of the plurality of branch leads extends in a first direction, each of the plurality of driving leads extends in a second direction, wherein the driving lead is electrically connected to the at least one of the plurality of light emitting points through at least one of the plurality of branch leads and configured to receive a driving signal from one of the plurality of pixel driving circuits, the second direction intersects the first direction,
   the plurality of branch leads comprise a first lead and a second lead, the plurality of light emitting points comprise a first light emitting component and a second light emitting component, the first light emitting component and the second light emitting component are adjacent to each other and are arranged in the first direction, the first lead goes across the first light emitting component and is connected to the second light emitting component, the second lead goes across the second light emitting component and is connected to the first light emitting component, and the first lead and the second lead are two different leads, and
   the first lead and the second lead are connected to two driving leads that are arranged at opposite sides of the light emitting block, respectively.

2. The display panel according to claim 1, wherein, in a plan view of the display panel, an interval is provided between one of plurality of light emitting points and the pixel driving circuit connected thereto.

3. The display panel according to claim 1, wherein the plurality of pixel driving circuits are located in a first region, the plurality of light emitting points are located in a second region, the first region is located outside the second region, the plurality of pixel driving circuits are located outside the second region where the plurality of light emitting points are located.

4. The display panel according to claim 1, wherein
the plurality of electrode leads comprise at least one electrode lead of first type extends in the first direction, at least one electrode lead of second type extends in the second direction, and at least one electrode lead of third type extend in a third direction, the third direction is inclined with respect to the first direction and is inclined with respect to the second direction, and the first direction, the second direction, and the third direction are directions parallel with a surface of a substrate on which the plurality of electrode leads are provided.

5. The display panel according to claim 1, wherein the plurality of light emitting points are arranged in an array in the first direction and the second direction, and at least two of the plurality of electrode leads are inclined with respect to the first direction and are inclined with respect to the second direction, and an angle between the two of the plurality of electrode leads is an obtuse angle.

6. The display panel according to claim 1, wherein the electrode lead is made of a transparent conductive material or a metal.

7. The display panel according to claim 1, wherein, in a plan view of the display panel, a first end of the electrode lead overlaps with the pixel driving circuit connected to the electrode lead, and a second end of the electrode lead overlaps with the light emitting point connected to the electrode lead.

8. The display panel according to claim 1, wherein each of the plurality of light emitting points comprises an electrode, the electrode of the light emitting point is connected to one of the plurality of electrode leads, orthographic projections on a substrate of electrodes of different light emitting points are spaced apart from each other, at least two electrode leads of the plurality of electrode leads are located in different layers.

9. The display panel according to claim 8, wherein orthographic projections on the substrate of the at least two electrode leads in the different layers at least partially overlap.

10. The display panel according to claim 1, wherein at least two of the plurality of pixel driving circuits is connected to one of the plurality of light emitting points.

11. The display panel according to claim 1, wherein one of the plurality of pixel driving circuits is connected to at least two of the plurality of light emitting points.

12. The display panel according to claim 3, wherein the first region comprises a transition region located close to the second region, and the plurality of pixel driving circuits are located in the transition region.

13. The display panel according to claim 3, further comprising a light-shielding layer, wherein the light-shielding layer is located in the first region and not located in the second region.

14. The display panel according to claim 1, wherein the display panel further comprises a plurality of in situ pixel driving circuits, wherein the plurality of pixel driving circuits are distributed at intervals between the plurality of in situ pixel driving circuits.

15. The display panel according to claim 1, wherein each of plurality of light emitting points comprise an electrode, and the electrode of the light emitting point is connected to the electrode lead.

16. A display device comprising the display panel according to claim 1.

17. The display device according to claim 16, further comprising a photosensitive component, wherein the photosensitive component is located at a side of the display panel.

18. The display panel according to claim 4, wherein the plurality of electrode leads comprise at least one electrode lead of fourth type extends in a fourth direction, the fourth direction is parallel with a surface of the substrate on which the plurality of electrode leads are provided, the electrode lead of fourth type is inclined with respect to the electrode lead of third type, and an angle between the electrode lead of fourth type and the electrode lead of third type is an obtuse angle.

19. The display panel according to claim 1, further comprising: a plurality of pixel regions, wherein each of the plurality of pixel regions comprising a pixel island and a transparent region located on a periphery of the pixel island, the pixel island comprises the light emitting block,
wherein the pixel island comprises K active display areas,
a distance between adjacent ones of the K active display areas in the pixel island is less than a distance between the pixel islands in adjacent ones of the plurality of pixel regions,
each of the plurality of pixel regions comprises K sub-regions, K pixel driving circuits are disposed in the K sub-regions, respectively, the K pixel driving circuits are configured to drive the K active display areas, respectively, and the K is an integer greater than or equal to 2,
wherein the distance between adjacent ones of the K active display areas in the pixel island is less than one third of the distance between the pixel islands in adjacent ones of the plurality of pixel regions.

20. The display panel according to claim 1, wherein the plurality of light emitting units comprise a plurality of first light emitting units, the plurality of first light emitting units are arranged into a first matrix, and each of the first light emitting units comprises N first light emitting points arranged into a first sub-matrix, the N first light emitting points are located at N predetermined positions in the first sub-matrix, respectively, where N is an integer greater than one;
wherein the plurality of driving leads comprise N first driving leads, the N first driving leads are distributed at opposite sides of the light emitting block along a column direction of the first sub-matrix, and are electrically connected to the N first light emitting points in each first light emitting units of the light emitting block, respectively,
wherein an $n^{th}$ first driving lead of the N first driving leads is connected to the first light emitting point located at an $n^{th}$ position in the first sub-matrix in said each first light emitting unit and is configured to receive a first driving signal from one of the plurality of pixel driving circuits, where n is an integer and $1 \leq n \leq N$, and
wherein the first light emitting points in one and same row of the first sub-matrix in said each first light emitting unit are connected to the first driving leads located at one of the opposite sides of the light emitting block.

* * * * *